US011917746B2

United States Patent
Micovic et al.

(10) Patent No.: US 11,917,746 B2
(45) Date of Patent: Feb. 27, 2024

(54) LOW COST PANEL AESA WITH THERMAL MANAGEMENT

(71) Applicant: Raytheon Company, Waltham, MA (US)

(72) Inventors: Miroslav Micovic, Marana, AZ (US); Brandon W. Pillans, Plano, TX (US); Andrew D. Gamalski, Tucson, AZ (US); Andrew K. Brown, Hesperia, CA (US)

(73) Assignee: Raytheon Company, Waltham, MA (US)

( * ) Notice: Subject to any disclaimer, the term of this patent is extended or adjusted under 35 U.S.C. 154(b) by 141 days.

(21) Appl. No.: 17/660,261

(22) Filed: Apr. 22, 2022

(65) Prior Publication Data

US 2023/0345616 A1    Oct. 26, 2023

(51) Int. Cl.
*H05K 1/02* (2006.01)
*H05K 3/20* (2006.01)
*H05K 3/34* (2006.01)

(52) U.S. Cl.
CPC .......... *H05K 1/0209* (2013.01); *H05K 1/023* (2013.01); *H05K 1/0298* (2013.01); *H05K 3/205* (2013.01); *H05K 3/3436* (2013.01); *H05K 2201/0195* (2013.01); *H05K 2201/064* (2013.01); *H05K 2203/043* (2013.01); *H05K 2203/1453* (2013.01); *H05K 2203/304* (2013.01)

(58) Field of Classification Search
CPC .... H05K 1/0209; H05K 1/023; H05K 1/0298; H05K 3/205; H05K 3/3436
See application file for complete search history.

(56) References Cited

U.S. PATENT DOCUMENTS

| | | |
|---|---|---|
| 8,617,927 B1 | 12/2013 | Margomenos et al. |
| 9,214,404 B1 | 12/2015 | Margomenos et al. |
| 9,508,652 B1 | 11/2016 | Herrault et al. |
| 9,780,014 B1 | 10/2017 | Margomenos et al. |
| 9,837,372 B1 | 12/2017 | Herrault et al. |

(Continued)

OTHER PUBLICATIONS

PCT International Search Report and Written Opinion dated Jun. 9, 2023 for International Application No. PCT/US2023/062348; 13 Pages.

(Continued)

*Primary Examiner* — Jeremy C Norris
(74) *Attorney, Agent, or Firm* — DALY, CROWLEY, MOFFORD & DURKEE LLP

(57) ABSTRACT

A method of forming a heat spreader on a printed circuit board (PCB), having a power dissipating component operably coupled thereto, includes attaching a thermally and electrically conductive structure, to a first side of the PCB to define a first PCB region that includes the component and a second PCB region without. The underside of the component is underfilled to electrically insulate its solder contacts. A first protective layer is applied to the second region of the PCB. A conductive plating membrane is deposited to the first region, the second region, and to the structure. A second protective layer is applied over a portion of the conductive plating membrane that overlays the second region, leaving exposed the rest of the conductive plating membrane. An electrically and thermally conductive layer is electroplated over the exposed areas of the conductive plating membrane, to form a heat exchanger within the first region.

20 Claims, 25 Drawing Sheets

(56) References Cited

U.S. PATENT DOCUMENTS

| | | |
|---|---|---|
| 10,026,672 B1 | 7/2018 | Herrault et al. |
| 10,079,160 B1 | 9/2018 | Margomenos et al. |
| 10,483,184 B1 | 11/2019 | Herrault et al. |
| 2010/0319981 A1 | 12/2010 | Kapusta et al. |
| 2014/0168903 A1 | 6/2014 | Clay |

OTHER PUBLICATIONS

Low et al., "A Scalable Switchable Dual-Polarized 256-Element Ka-Band SATCOM Transmit Phased-Array with Embedded RF Driver and ±70° Beam Scanning;" Proceedings of the IEEE/MTT-S International Microwave Symposium; Jun. 2020; 4 Pages.

Margomenos et al., "Wafer-Level Packaging Method Incorporation Embedded Thermal Management for GaN-Based RF Front-Ends;" Proceedings of $14^{th}$ IEEE ITHERM Conference; May/Jun. 2014; 6 Pages.

Su et al., "Novel Package Technology of Ultra High Power Light-Emitting Diodes by Electroplating;" 2007 IEEE Compound Semiconductor Integrated Circuits Symposium; Oct. 2007; 4 Pages.

Taiwan Office Action (with English Translation) dated Dec. 5, 2023 for Taiwan Application No. 112106057; 37 Pages.

Back Side

Front Side

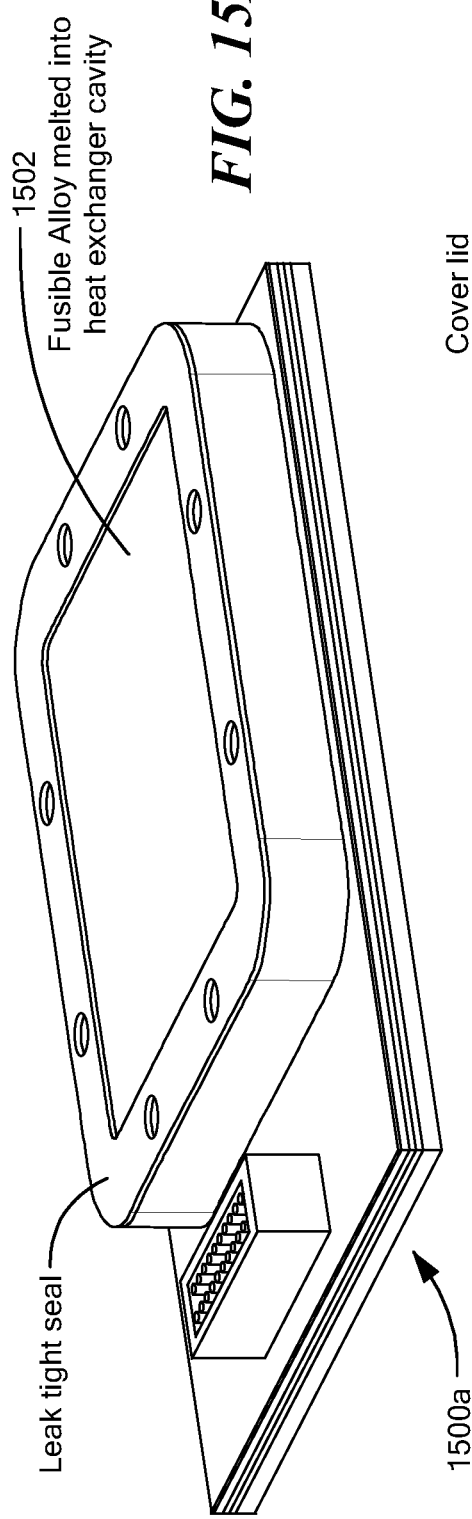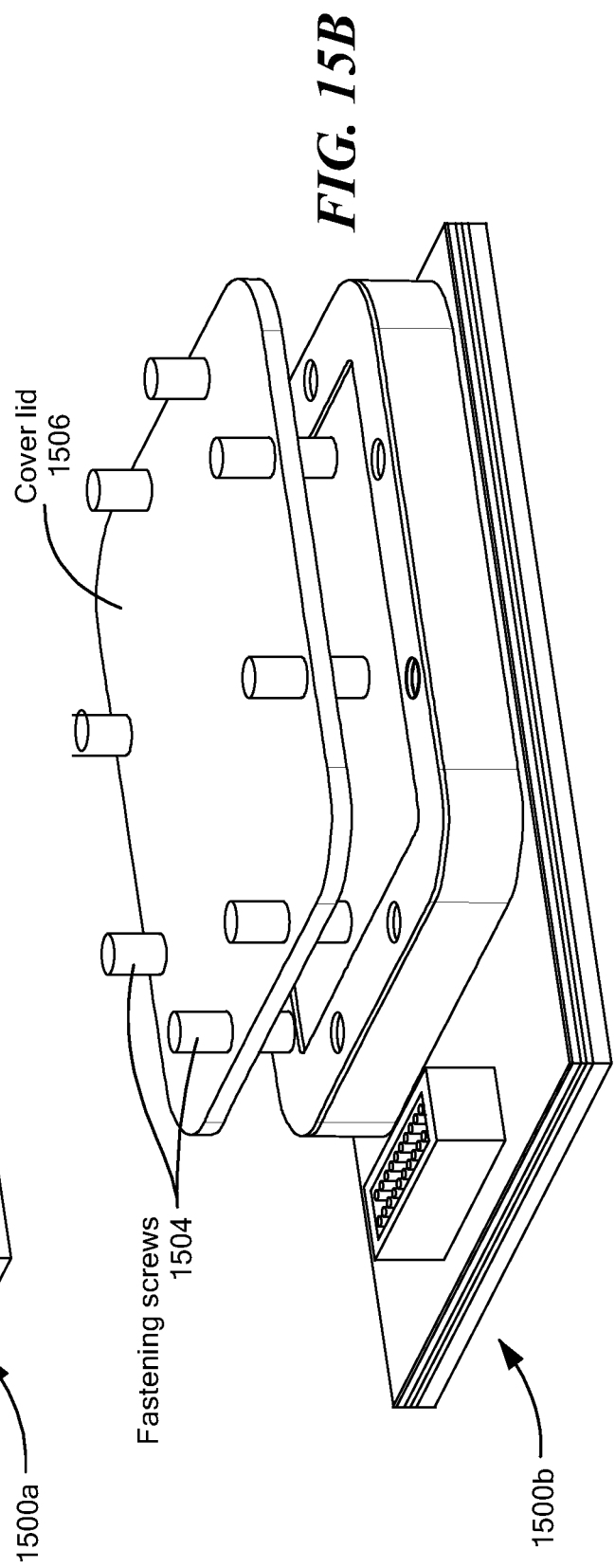
FIG. 15A
FIG. 15B

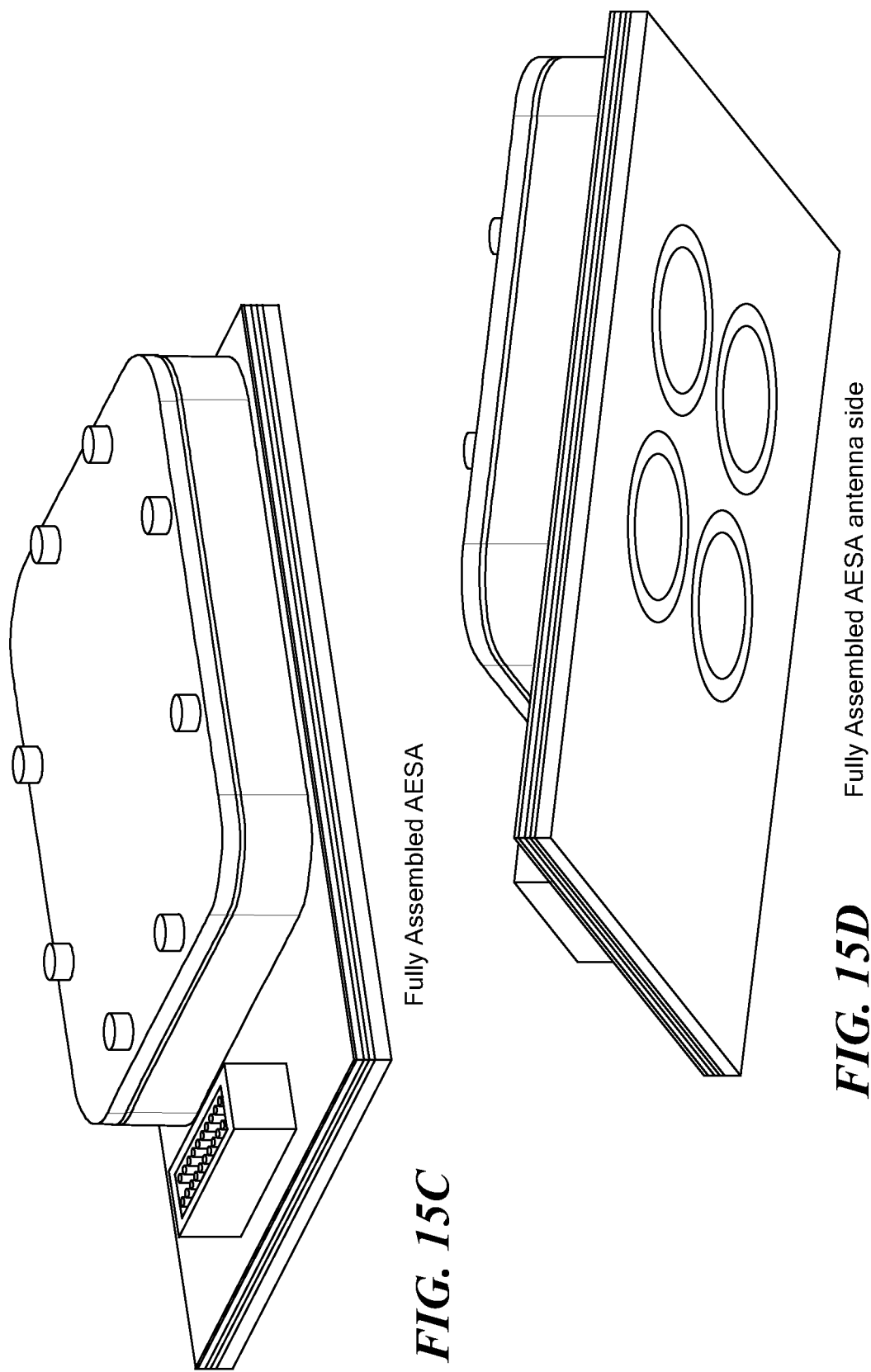
FIG. 15C  Fully Assembled AESA
FIG. 15D  Fully Assembled AESA antenna side

LOW COST PANEL AESA WITH THERMAL MANAGEMENT

FIELD

Embodiments of the disclosure generally relate to devices, systems, and methods for cooling of chips and printed circuit boards.

BACKGROUND

Antenna arrays for radar systems can include AESA (active electronically scanned array) antennas, as is known in the art. Typically, the basic building block of an AESA is the Transmit/Receive (T/R) module, which can be packaged to form an AESA antenna element, and may include a radiator, receiver Low Noise Amplifier (LNA), transmit Power Amplifier (PA), and various digitally controlled phase or delay and gain components. Several of these T/R modules are placed on antenna panels in a grid format for transmitting and receiving radar signals. Digital control of the transmit/receive gain and phase allows an AESA antenna to steer or point the resultant antenna beam without physically moving the antenna panel. Modern day low cost AESA antenna panels employ printed circuit radiators connected to surface mount Monolithic Microwave Integrated Circuit (MMIC) devices that contain the LNA, PA and phase/gain control circuitry, all on a single printed circuit board (PCB).

AESAs that are fabricated using multilayer printed circuit board panels and flip chip die attach are attractive, due to low fabrication cost and great scaling potential to large array sizes. An example of this type of low cost AESA is described in a publication by Kevin Kai Wei Low et al., entitled, "A Scalable Switchable Dual-Polarized 256 Element Ka-band SATCOM Transmit Phased-array with Embedded RF Driver and ±70° Beam Scanning", 2020 IEEE/MTT-S International Microwave Symposium, pp 821-824 (hereinafter "Low reference"), which is hereby incorporated by reference. In this type of AESA a single multilayer printed circuit board panel provides the following functions:

1) Distribution of DC power,
2) Distribution of RF signal (LO and IF in some instances)
3) Distribution of digital control signals
4) Provides an Array of Antennas at roughly half wavelength ($\lambda/2$) element spacing required for ±>60° beam steering.
5) Provides mechanical support.

In this type of AESA all active components and passive components are attached to one side of the printed circuit board panel, while Antenna Array is on the opposite side of the panel. For example, FIG. 1A is back side perspective view 100A of a prior art 2×2 element printed circuit panel AESA, such as the type referenced in the aforementioned Low reference, and FIG. 1B is a front side perspective view 100B of the prior art 2×2 element printed circuit panel AESA of FIG. 1A. As shown in FIGS. 1A, the AESA element is formed using a multilayer printed circuit board (PCB) panel. The back side includes a plurality of T/R radio frequency integrated circuit (RFIC) components 104, capacitors 106, and a connector 108, which for purposes of illustration is a printed circuit board (PCB) D-connector. The front side includes a plurality of antenna elements 110.

SUMMARY

The following presents a simplified summary in order to provide a basic understanding of one or more aspects of the embodiments described herein. This summary is not an extensive overview of all of the possible embodiments and is neither intended to identify key or critical elements of the embodiments, nor to delineate the scope thereof. Rather, the primary purpose of the summary is to present some concepts of the embodiments described herein in a simplified form as a prelude to the more detailed description that is presented later.

The type of prior art AESA shown in FIGS. 1A and 1B is well suited for applications where total heat dissipated by electronics per printed circuit board panel area is roughly 5 Watts per square centimeter (W/cm$^2$) or less, because it is challenging to integrate effective heat management solution that support higher heat flux densities into a planar panel topology due to large height mismatch between mounted components.

The high RF power Gallium Nitride (GaN) MMIC's, which are required to extend AESA range, are not compatible with multilayer printed circuit board AESA architecture, because they generate heat fluxes well in excess of 5 watts per square centimeter (W/cm$^2$) of the panel area. However, the Silicone Germanium (SiGe) and complementary metal oxide semiconductor (CMOS) Radio Frequency Integrated Circuits (RFICs) that produce low to moderate levels of RF power (output power in 1 milliwatt (mW) to 100 mW range) and simultaneously provide beam-forming functionality are well suited for multilayer printed circuit board panel AESA, as they generate less than 5 W/cm$^2$ of heat density per panel area.

For a given aperture arrangement and frequency band the maximum range $R_{max}$ of a communication RF system is proportional to $\sqrt{Ptx}$. ($R_{max} \propto \sqrt{Ptx}$), where Ptx is the average magnitude of radiated RF power of AESA during a transmit cycle.

The high RF power GaN or GaAs MMIC components (output power in 1 W-100 W range) are very attractive for AESA, because they can extend maximum operating range $R_{max}$ of an AESA communication array by a factor of 3 to 30 over $R_{max}$ that can be achieved from the same aperture size with AESA that is using only SiGe or CMOS RFIC's. However, the high power GaN or GaAs MMIC components also generate much more heat than lower power RFIC's, which makes their integration into printed circuit board AESA panel a challenge.

There have been recent developments involving use of heat spreaders that are fabricated by electroplating a copper (Cu) sheet directly over the bare chip die; these arrangements have demonstrated significant improvement in heat dissipation of high power Light Emitting Diodes (e.g., as documented in Y. K. Su et al., "Novel Package Technology of Ultra High Power Light-Emitting Diodes by Electroplating", 2007 IEEE Compound Semiconductor Integrated Circuits Symposium, DOI: 10.1109/CSICS07.2007.9, which is hereby incorporated by reference) and further for GaN MMIC chips (e.g., as documented in A. Margomenos et al., "Wafer-Level Packaging Method Incorporating Embedded Thermal Management for GaN-Based RF Front-Ends", 14th IEEE ITHERM Conference, pp 976-981, DOI: 10.1109/ITHERM.2014.6892387, which is hereby incorporated by reference. In addition, there are a number of US Patents that have issued on this topic, including:

U.S. Pat. No. 8,617,927 ("METHOD OF MOUNTING ELECTRONIC CHIPS") (which shares an inventor in common with the present disclosure)

U.W. #9214404 ("APPARATUS FOR MOUNTING ELECTRONIC CHIPS") (which shares an inventor in common with the present disclosure);

U.S. Pat. No. 9,508,652 ("DIRECT IC-TO-PACKAGE WAFER LEVEL PACKAGING WITH INTEGRATED THERMAL HEAT SPREADERS");

U.S. Pat. No. 9,780,014 ("SIMULTANEOUS CONTROLLED DEPTH HOT EMBOSSING AND ACTIVE SIDE PROTECTION DURING PACKAGING AND ASSEMBLY OF WIDE BANDGAP DEVICES") (which shares an inventor in common with the present disclosure);

U.S. Pat. No. 9,837,372 ("WAFER-LEVEL DIE TO PACKAGE AND DIE TO DIE INTERCONNECTS SUSPENDED OVER INTEGRATED HEAT SINKS") (which shares an inventor in common with the present disclosure);

U.S. Ser. No. 10/026,672 ("RECURSIVE METAL EMBEDDED CHIP ASSEMBLY") ((which shares an inventor in common with the present disclosure);

U.S. Ser. No. 10/079,160 ("SURFACE MOUNT PACKAGE FOR SEMICONDUCTOR DEVICES WITH EMBEDDED HEAT SPREADERS") ((which shares an inventor in common with the present disclosure); and U.S. Ser. No. 10/483,184 ("RECURSIVE METAL EMBEDDED CHIP ASSEMBLY") ((which shares an inventor in common with the present disclosure).

Each of the above-listed publications and U.S. patents is hereby incorporated by reference.

In certain embodiments herein, systems, methods, and apparatuses are provided for implementing effective thermal management to panel AESA architecture. In accordance with certain embodiments herein, at least some of these improvements in thermal management enable integration of high power MIMIC's into low cost printed circuit board panel AESA's. Further, at least some embodiments herein provide advantageous techniques to integrate a heat exchanger into a printed circuit board AESA panel as a part of panel fabrication process.

In one embodiment, a method of forming a heat spreader on a printed circuit board (PCB), is provided. A PCB is provided having first and second sides and having a power dissipating component operably coupled to a first side of the PCB, the power dissipating component having an underside disposed adjacent to the first side of the PCB and having a plurality of solder contacts disposed therein. A structure is attached to the first side of the PCB, the structure comprising a thermally and electrically conductive material having a shape configured to define and separate first and second regions of the PCB, wherein the first region of the PCB includes the power dissipating component, and the second region of the PCB does not include the power dissipating component. A space between the underside of the power dissipating component and the first side of the PCB is underfilled with a first electrically insulating material configured to electrically insulate the solder contacts of the power dissipating component. A layer of first temporary protective material is applied to the second region of the PCB. A conductive plating membrane is deposited to the first region, the second region, and to the structure, wherein a first portion of the conductive plating membrane is configured to overlay the structure, the power dissipating component, and the first region, and wherein a second portion of the conductive plating membrane is configured to overlay the second region. A layer of second temporary protective material is applied over the second portion of the conductive plating membrane, wherein the layer of the second temporary protective material is configured to leave an exposed first portion of the conductive plating membrane. An electrically and thermally conductive continuous sheet of material is electroplated over the exposed first portion of the conductive plating membrane, the electroplating configured to couple the electrically and thermally conductive continuous sheet of material to the structure, the power dissipating component, and to areas of the first side of the PCB that fall within the first region and which are not operably coupled to the power dissipating component, to form a heat exchanger.

In some embodiments, a solder reflow is performed after attaching the structure and before underfilling the space, wherein the solder reflow is configured to establish soldered bond contact between the power dissipating component, the structure, and the PCB. In some embodiments, the PCB further comprises at least one passive component disposed in the first region of the PCB and the method further comprises forming a protective structure around the passive component using a second electrically insulating material, prior to depositing the conductive plating membrane.

In some embodiments, the electroplating is configured to provide a void-free interface between the heat exchanger and the power dissipating component. In some embodiments, the electroplating is configured to provide a void free interface between the heat exchanger and the heat dissipating component and between the heat exchanger and the protective structure. In some embodiments, the structure comprises a heat exchanger frame configured to surround the power dissipating component.

In some embodiments, a forced flow cooling manifold is coupled to the structure after the electroplating. In some embodiments, the structure and the electrically and thermally conductive continuous sheet of material, from the electroplating, together are configured to form a cavity within the heat exchanger and the method further comprises disposing a portion of fusible material within the cavity, melting the fusible material to enable the fusible material to make thermal contact with a portion of the heat exchanger that is coupled to the power dissipating component, and coupling a lid to the structure after the fusible material has solidified, the lid configured to make thermal contact with the fusible material.

In some embodiments, the portion of fusible material is a quantity that is sufficient, when melted to fill the cavity enough to form a leak-tight seal between the fusible material and the structure. In some embodiments, after the electroplating, the layer of second temporary protective material is removed to expose the second portion of the conductive plating membrane, the second portion of conductive plating membrane is removed, and the layer of first temporary protective material is removed.

In some embodiments, a forced flow cooling manifold is coupled to the structure after the layer of first temporary protective material is removed. In some embodiments, the structure and the electrically and thermally conductive continuous sheet of material, from the electroplating, together are configured to form a cavity within the heat exchanger and the method further comprises, after the layer of first temporary protective material is removed: disposing a portion of fusible material within the cavity; melting the fusible material to enable the fusible material to make thermal contact with a portion of the heat exchanger that is coupled to the power dissipating component; and coupling a lid to the structure after the fusible material has solidified, the lid configured to make thermal contact with the fusible material.

In another aspect, a cooling apparatus is provided. The cooling apparatus comprises a structure configured for coupling to a first side of a printed circuit board (PCB) having first and second sides and having at least a power dissipating component operably coupled to the first side, the power dissipating component having an underside comprising a plurality of solder contacts in operable communication with the PCB, wherein the structure comprises a thermally and electrically conductive material and is configured to define and separate first and second regions of the PCB when the structure is attached to the PCB, wherein the first region of the PCB is configured to surround the power dissipating component and the second region of the PCB lies outside of the structure and does not include the power dissipating component. The cooling apparatus also comprises an electrically and thermally conductive continuous sheet of material thermally and electrically coupled to the structure and configured to be in void-free thermal contact with the power dissipating component and in void-free thermal contact with all areas in the first region of the PCB that do not contain the power dissipating component, wherein the structure and the electrically and thermally conductive sheet of material, when thermally and electrically coupled together, form a heat exchanger.

In some embodiments, the cooling apparatus further comprises a forced flow cooling manifold coupled to the structure. In some embodiments, the structure and the electrically and thermally conductive continuous sheet of material together are configured to form a cavity within the heat exchanger and further comprising a portion of thermally conductive fusible material disposed within and configured to fill the cavity to form a leak-tight seal between the portion of thermally conductive fusible material and the structure. In some embodiments, the structure comprises a heat exchanger frame configured to surround the power dissipating component.

In a further aspect, a method is provided for cooling a power dissipating component operably coupled to a first side of a printed circuit board (PCB), the power dissipating component having an underside disposed adjacent to the first side of the PCB and having a plurality of solder contacts disposed thereon. The method comprises attaching a structure to the first side of the PCB, the structure comprising a thermally and electrically conductive material having a shape configured to define and separate first and second regions of the PCB, wherein the first region of the PCB includes the power dissipating component, and the second region of the PCB does not include the power dissipating component. The method also comprises underfilling a space between the underside of the power dissipating component and the first side of the PCB with a material configured to electrically insulate the solder contacts of the power dissipating component. The method also comprises applying a layer of first temporary protective material to the second region of the PCB. The method also comprises depositing a conductive plating membrane to the first region, the second region, and to the structure, wherein a first portion of the conductive plating membrane is configured to overlay the structure, the power dissipating component, and the first region, and wherein a second portion of the conductive plating membrane is configured to overlay the second region. The method also comprises applying a layer of second temporary protective material over the second portion of the conductive plating membrane, wherein the layer of the second temporary protective material is configured to leave an exposed first portion of the conductive plating membrane. The method also comprises electroplating an electrically and thermally conductive continuous sheet of material over the exposed first portion of the conductive plating membrane, the electroplating configured to couple the electrically and thermally conductive continuous sheet of material to the structure, the power dissipating component, and to areas of the first side of the PCB that fall within the first region and which are not operably coupled to the power dissipating component, to form a heat exchanger configured for cooling the power dissipating component, wherein the electroplating is configured to provide a void-free interface between the heat exchanger and the power dissipating component.

In some embodiments, the method for cooling the power dissipating component further comprises coupling a forced flow cooling manifold to the structure after the electroplating. In some embodiments, the structure and the electrically and thermally conductive continuous sheet of material, from the electroplating, together are configured to form a cavity within the heat exchanger and the method for cooling the power dissipating component further comprises: disposing a portion of fusible material within the cavity; melting the fusible material to enable the fusible material to make thermal contact with a portion of the heat exchanger that is coupled to the power dissipating component; and coupling a lid to the structure after the fusible material has solidified, the lid configured to make thermal contact with the fusible material.

In some embodiments, the method further comprises, after the electroplating, the method for cooling the power dissipating component further comprises removing the layer of second temporary protective material to expose the second portion of the conductive plating membrane, removing the second portion of conductive plating membrane, and removing the layer of first temporary protective material.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the claims included herein.

Details relating to these and other embodiments are described more fully herein.

BRIEF DESCRIPTION OF THE DRAWINGS

The advantages and aspects of the described embodiments, as well as the embodiments themselves, will be more fully understood in conjunction with the following detailed description and accompanying drawings, in which:

FIG. 15A is perspective view of a first aspect of a fusible material attachment process, in accordance with one embodiment;

FIG. 15B is a perspective view of a second aspect of a fusible material attachment process, in accordance with one embodiment;

FIG. 15C is a first perspective view of a fully assembled AESA panel after the fusible material attachment process, in accordance with one embodiment; and FIG. 15D is a second perspective view of the fully assembled AESA panel of FIG. 13C, showing the antenna side, in accordance with one embodiment.

The drawings are not to scale, emphasis instead being on illustrating the principles and features of the disclosed embodiments. In addition, in the drawings, like reference numbers indicate like elements.

DETAILED DESCRIPTION

Figure 1A:
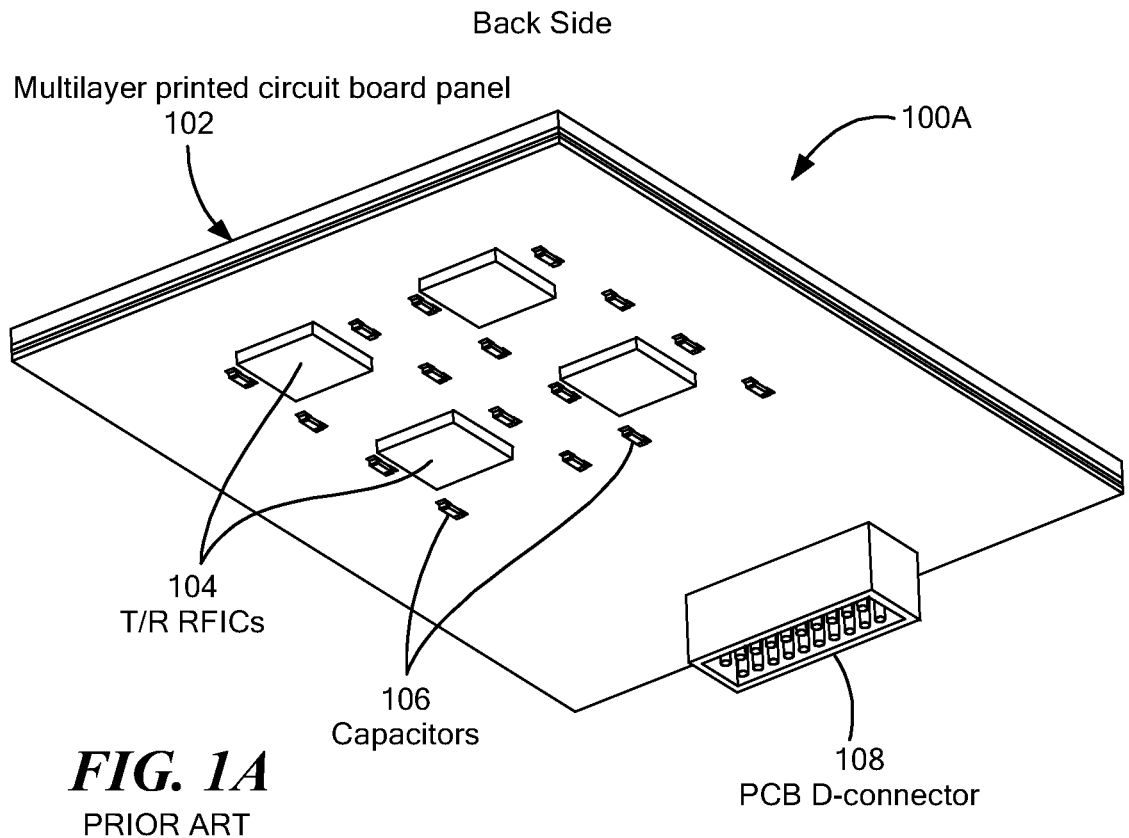
FIG. 1A is a back side perspective view of a prior art 2×2 element printed circuit panel AESA.
Figure 1B:
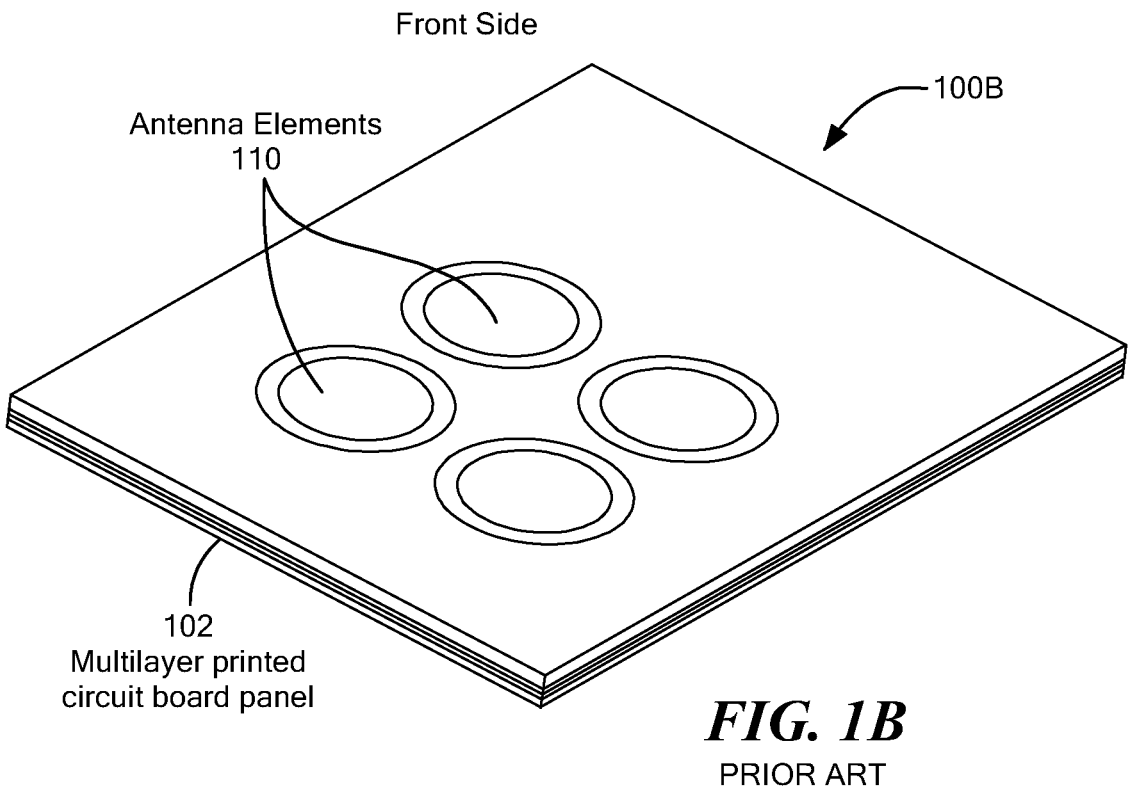
FIG. 1B is a front side perspective view of the prior art 2×2 element printed circuit panel AESA of FIG. 1A.

Before describing details of the particular systems, devices, and methods, it should be observed that the concepts disclosed herein include but are not limited to a novel structural combination of components and circuits, and not necessarily to the particular detailed configurations thereof. Accordingly, the structure, methods, functions, control and arrangement of components and circuits have, for the most part, been illustrated in the drawings by readily understandable and simplified block representations and schematic diagrams, in order not to obscure the disclosure with structural details which will be readily apparent to those skilled in the art having the benefit of the description herein.

For convenience, certain concepts and terms used in the specification are collected here. The following terminology definitions may be helpful in understanding one or more of the embodiments described herein and should be considered in view of the descriptions herein, the context in which they appear, and knowledge of those of skill in the art:

Unless specifically stated otherwise, those of skill in the art will appreciate that, throughout the present detailed description, discussions utilizing terms such as "opening", "configuring," "receiving,", "detecting," "retrieving," "converting", "providing,", "storing," "checking", "uploading", "sending,", "determining", "reading", "loading", "overriding", "writing", "creating", "including", "generating", "associating", and "arranging", and the like, refer to the actions and processes of a computer system or similar electronic computing device. The computer system or similar electronic computing device manipulates and transforms data represented as physical (electronic) quantities within the computer system's registers and memories into other data similarly represented as physical quantities within the computer system memories or registers or other such information storage, transmission, or display devices. The disclosed embodiments are also well suited to the use of other computer systems such as, for example, optical and mechanical computers. Additionally, it should be understood that in the embodiments disclosed herein, one or more of the steps can be performed manually.

Before describing in detail the particular improved systems, devices, and methods, it should be observed that the concepts disclosed herein include but are not limited to a novel structural combination of software, components, and/or circuits, and not necessarily to the particular detailed configurations thereof. Accordingly, the structure, methods, functions, control and arrangement of components and circuits have, for the most part, been illustrated in the drawings by readily understandable and simplified block representations and schematic diagrams, in order not to obscure the disclosure with structural details which will be readily apparent to those skilled in the art having the benefit of the description herein.

In certain embodiments herein, systems, methods, and apparatuses are provided that include a technique to attach a heat exchanger to a printed circuit board (PCB) AESA panel by electroplating a sheet of electrically conductive material, (e.g., 100 μm-200 μm thick Copper (Cu) sheet) directly over the active components that are attached to a printed circuit board panel to achieve a void free thermal interface between active components and the heat exchanger. This electrodeposited, electrically conductive sheet (e.g., a Cu sheet) acts as a heat spreader and is also an integral part of the heat exchanger. The electrically conductive sheet also provides a leak tight seal between the heat exchanger and active components and, hence, enables implementation of highly effective heat extraction techniques such as: forced flow liquid cooling, forced flow liquid-vapor dual phase cooling, or heat extraction by phase change of fusible material. In addition, certain embodiments herein provide processes for applying this sheet so as to achieve a void free thermal interface between active components and the heat exchanger.

Figure 2:
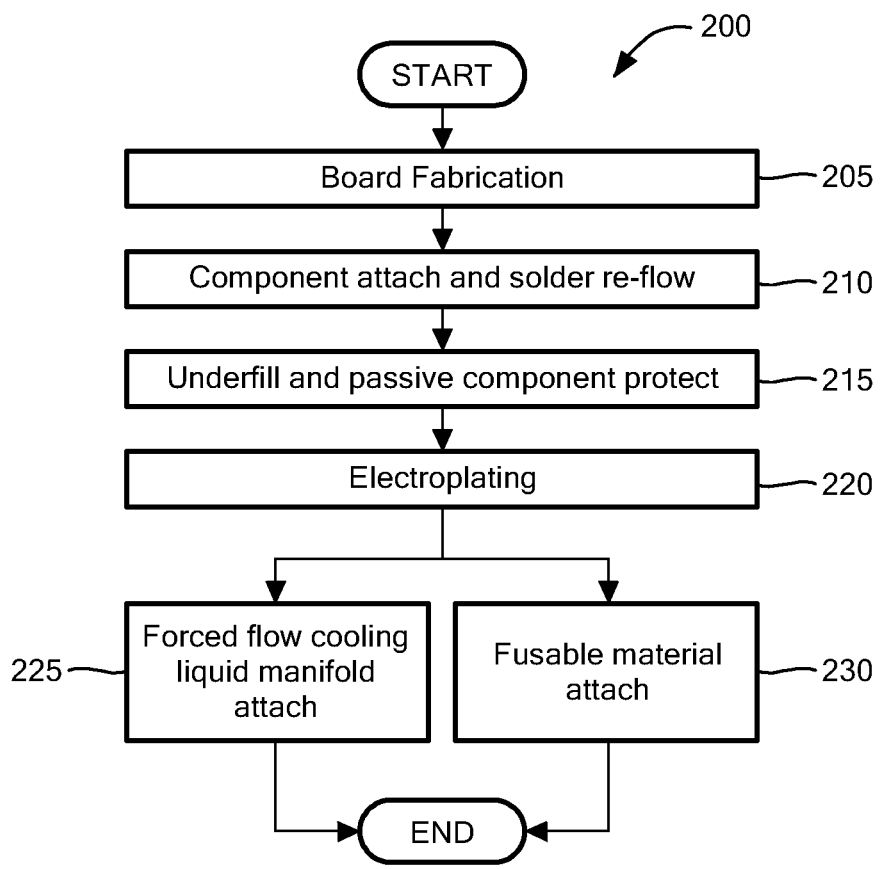
FIG. 2 is a flow chart of a high level process for manufacturing the AESA panels of FIG. 4-15D, in accordance with one embodiment.

The following description includes detailed exemplary processes describing how a heat exchanger is attached to a printed circuit board panel AESA according to certain embodiments. The processes and embodiments include at least two potential implementations of the heat exchanger apparatus assembly:

1) Heat extraction by forced liquid flow or forced flow liquid-vapor dual phase cooling
2) Heat extraction by phase change of fusible material FIGS. 2A through 15B, discussed further below, show fabrication flow of a printed circuit board panel AESA according to some embodiments. FIG. 2 is a flow chart of a high level process 200 for manufacturing the AESA panels of FIG. 4-15D, in accordance with one embodiment. The high level process of FIG. 2 is applicable to other types of printed circuit panels, as well. The high level process steps include board fabrication (block 205), component attach and solder reflow (block 210), underfill and passive component protect (block 215), electroplating (block 220), and then a choice between two alternative final steps, either forced flow cooling liquid manifold attach (block 225) or fusible material attach (block 230). Each of these steps is explained in greater detail herein, including the more detailed exemplary manufacturing process of FIGS. 3A-3B and the illustrations of FIGS. 4A-15D.

Figure 3A:
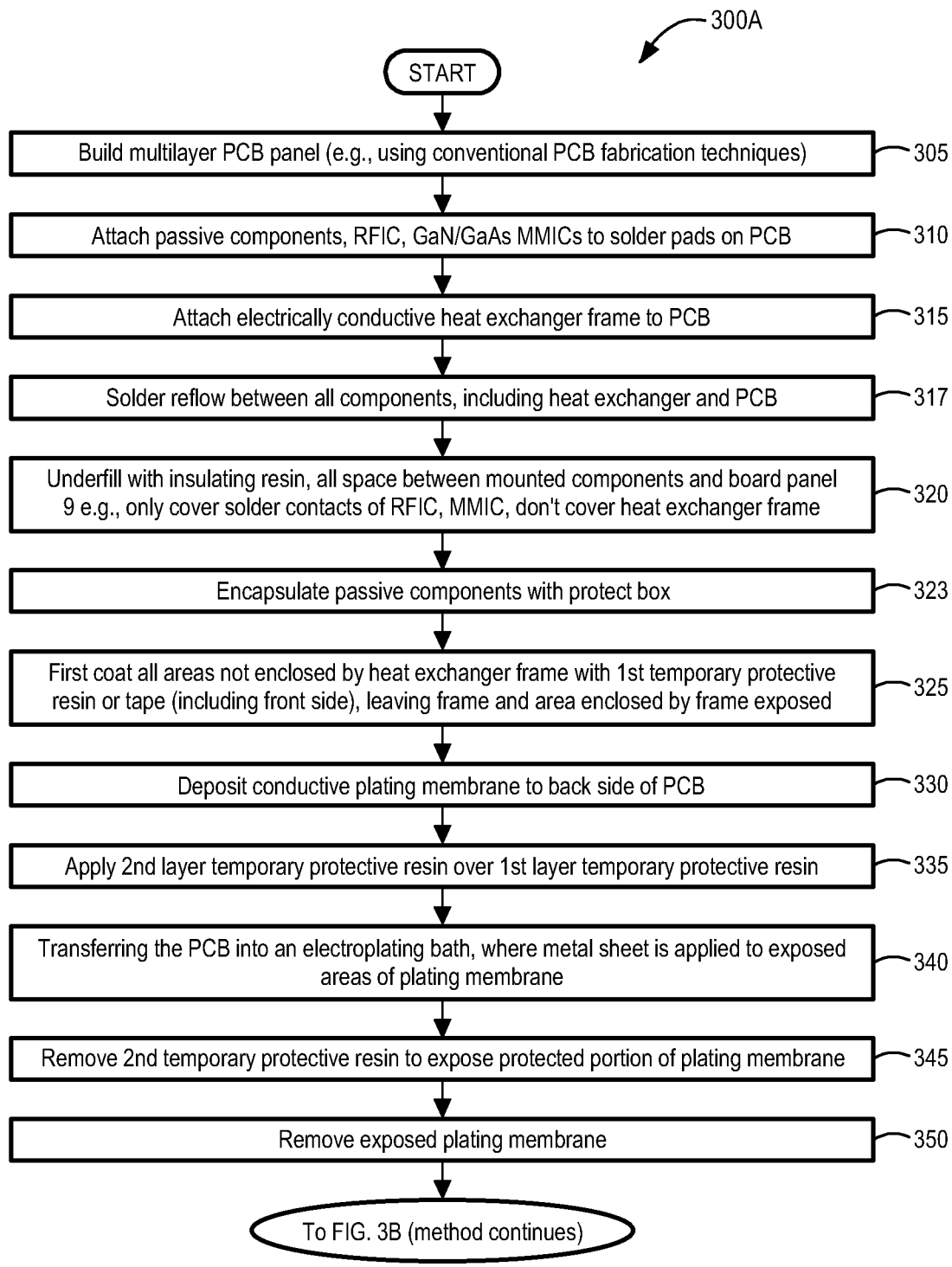
FIG. 3A is a first part of a detailed process for manufacturing the AESA panels of FIGS. 4-15D, in accordance with one embodiment.
Figure 3B:
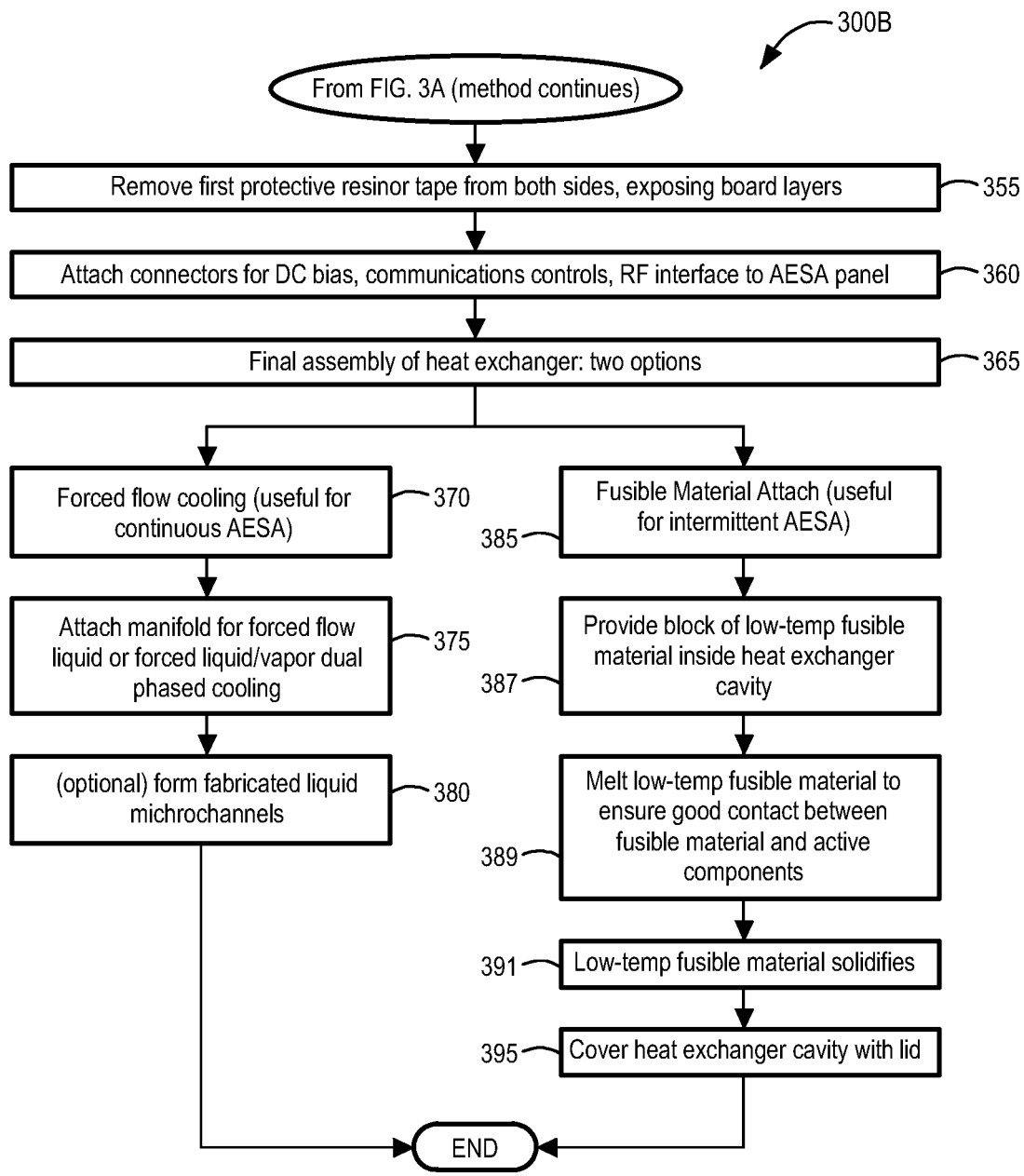
FIG. 3B is a second part of a detailed process for manufacturing the AESA panels of FIGS. 4-15D, in accordance with one embodiment.
Figure 4A:
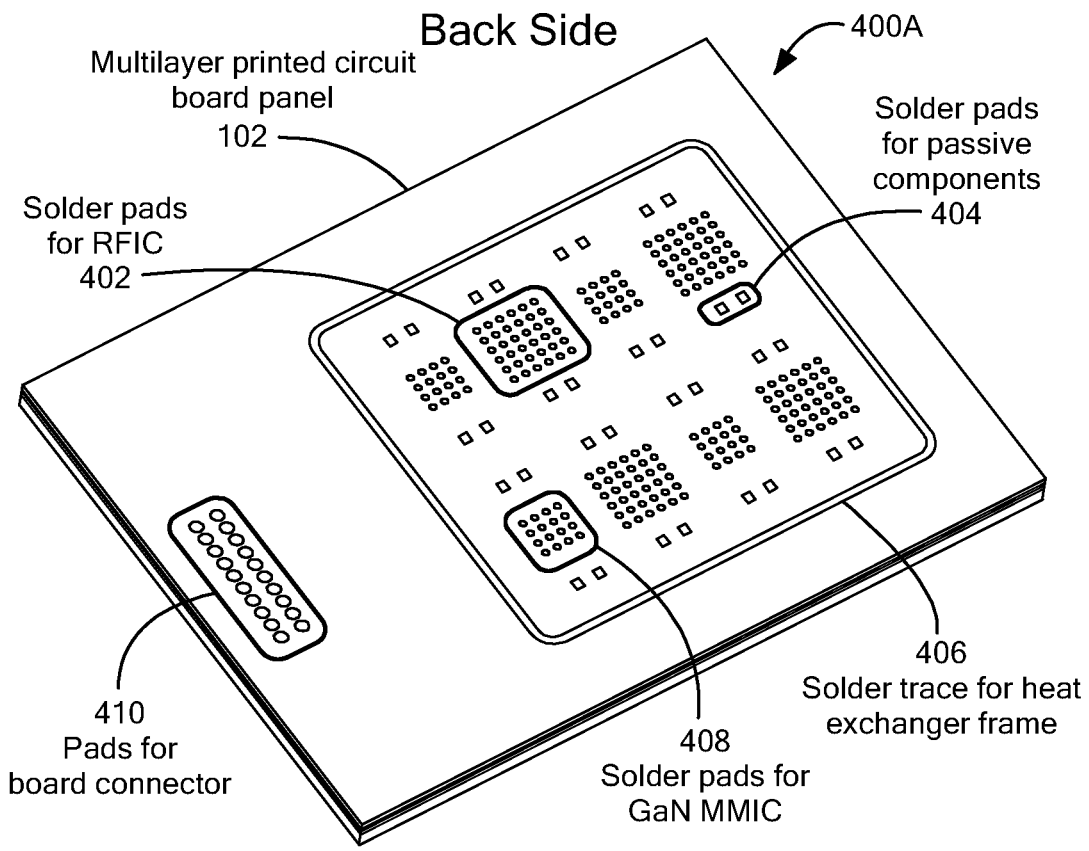
FIG. 4A is perspective view of the back side of a 2×2 element printed circuit panel AESA that is constructed in accordance with one embodiment.
Figure 4B:
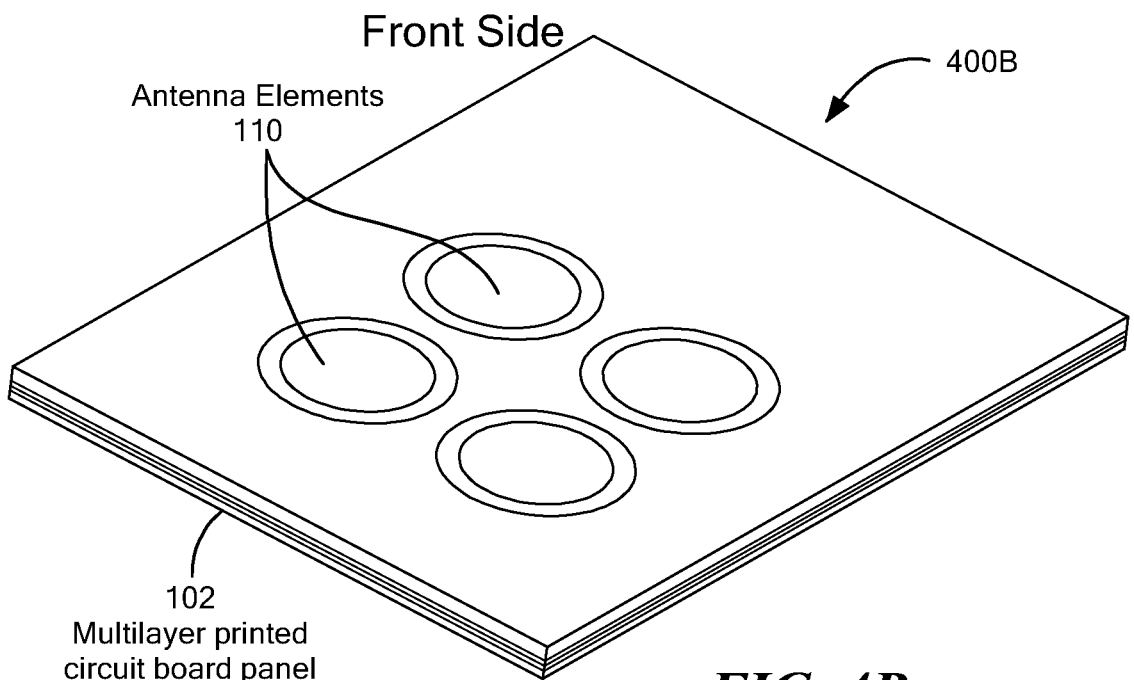
FIG. 4B is a perspective view of the front side of the 2×2 element printed circuit panel AESA of FIG. 4A, that is constructed in accordance with one embodiment.

FIG. 3A is a first part 300A of a detailed process for manufacturing the AESA panels of FIGS. 4-15D, in accordance with one embodiment, and FIG. 3B is a second part 300B of a detailed process for manufacturing the AESA panels of FIGS. 4-15D, in accordance with one embodiment. Referring to FIG. 3A, in block 305, 1 a multilayer printed circuit board panel is built using conventional printed circuit board fabrication techniques. For example, FIG. 4A is perspective view 400A of the back side of a 2×2 element printed circuit panel AESA PCB 102 that is constructed in accordance with one embodiment. FIG. 4B is a perspective view of the front side 400B of the 2×2 element printed circuit panel AESA PCB 102 of FIG. 4A. One side of the PCB 102, the back side in this example, contains solder pads and solder traces for attachment of active and passive components, such as solder pads 402 for RFIC, solder pads 404 for passive components, solder trace 406 for a heat exchanger frame (discussed further herein), solder pads 408 for a GaN MMIC, and pads for a board connector 410.

Figure 5:
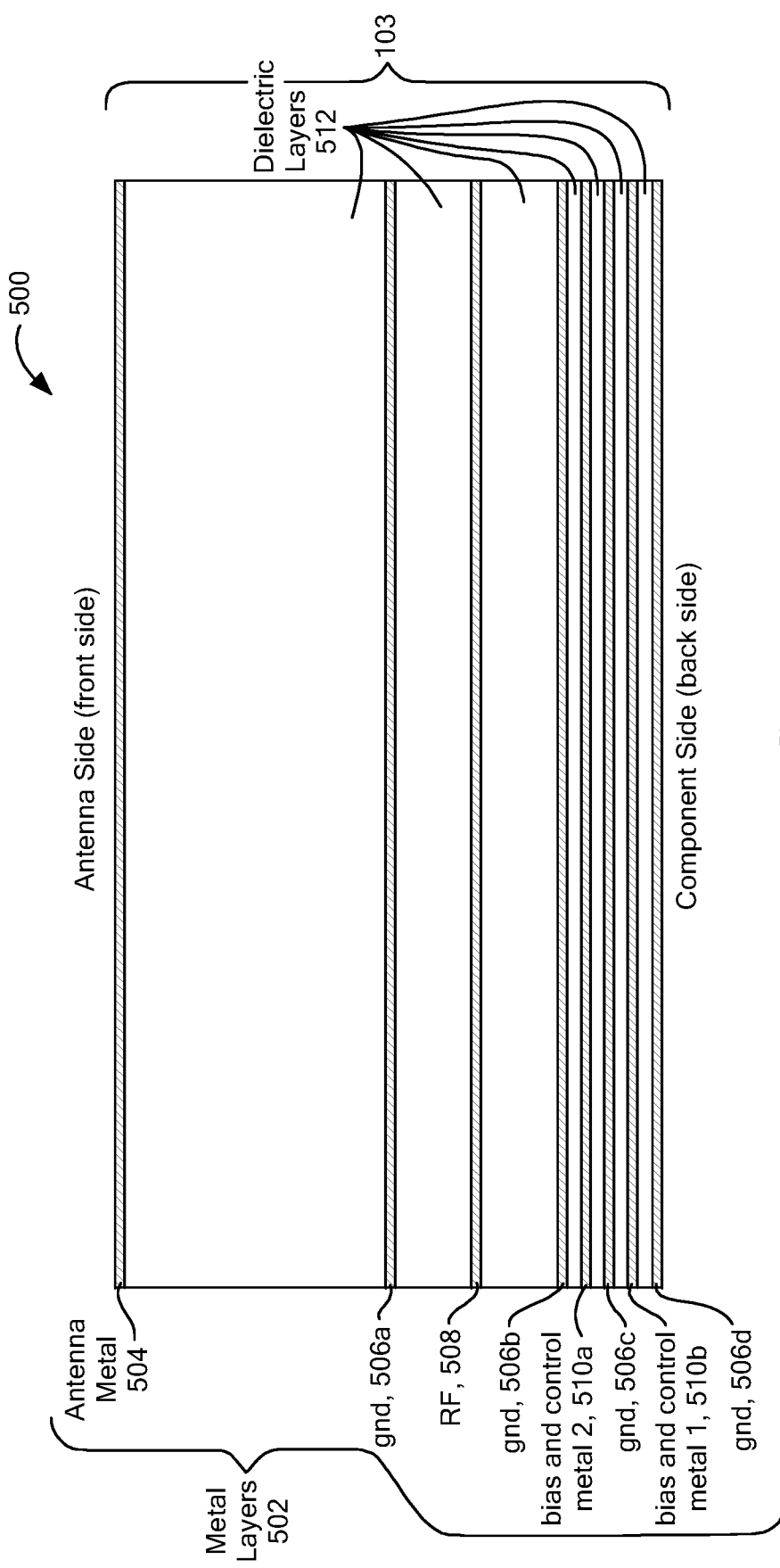
FIG. 5 is a cross-sectional view of an exemplary printed circuit board stack for fabrication of the panel AESA of FIGS. 4A-4B, in accordance with one embodiment.

FIG. 5 is a cross-sectional view 500 of an exemplary printed circuit board stack 103 for fabrication of the panel AESA PCB 102 of FIGS. 4A-4B, in accordance with one embodiment. That is, FIG. 5 is a cross sectional view of a portion of the PCB 102 of FIGS. 4A-4B. The stack 103 of FIG. 5 includes a plurality of metal layers 502 and uses two metal layers 510a, 510b for routing of DC bias and control communications, one metal layer 508 for RF routing and one metal layer 504 for antenna fabrication. The stack 103 that consists of dielectric 512, ground metal layers 506a, 506b, 506c, 506d, and more dielectric 512 separates these "active" metal layers to minimize cross talk and interference between active metal traces.

Figure 6A:
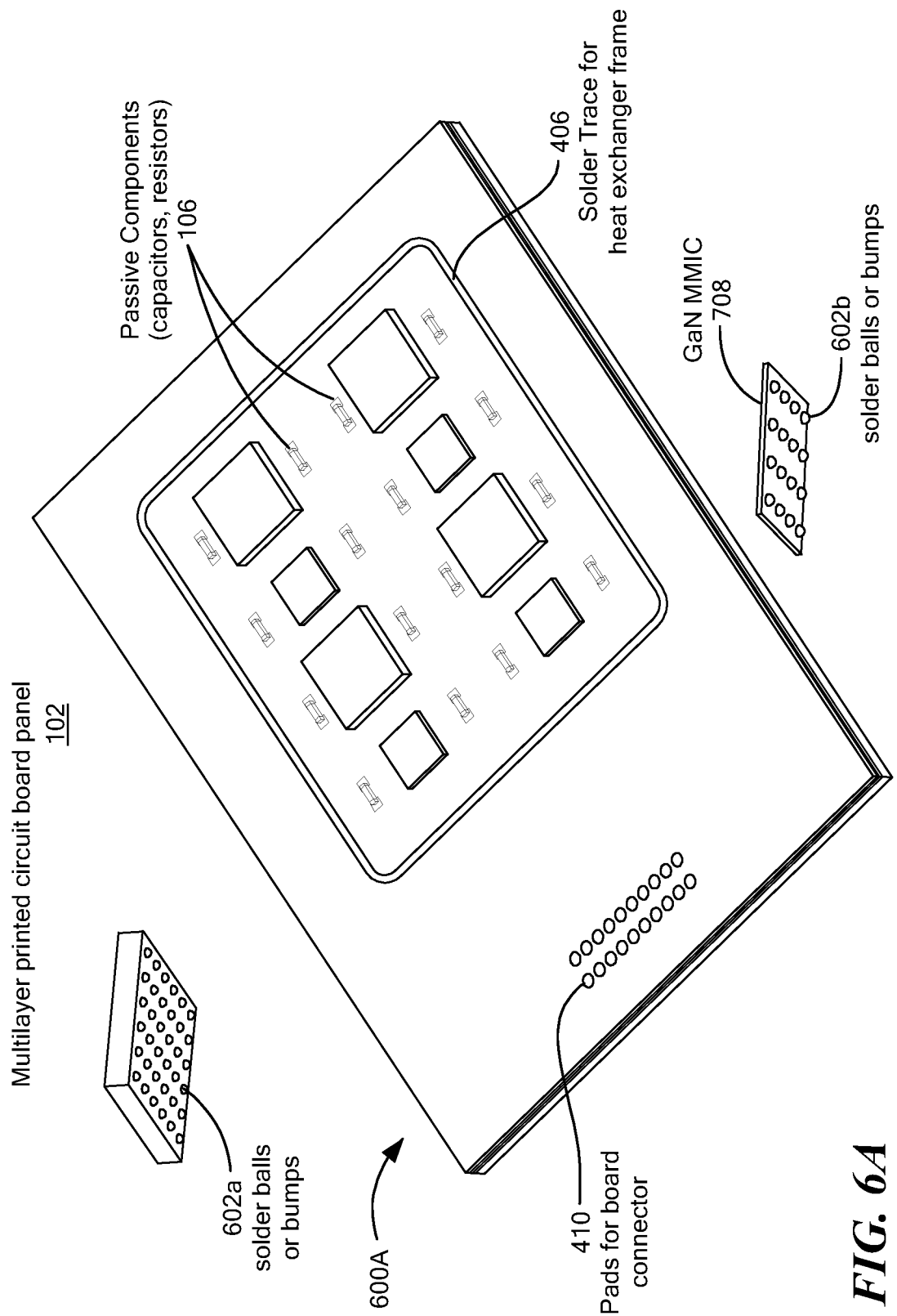
FIG. 6A is a perspective view of a fabrication step where RFICs, MMICs, and passive components are attached to the corresponding solder pads on a PCB, in accordance with one embodiment.

Reference is now made again to the method of FIG. 3A and also to FIG. 6A, which is a perspective view 600A of a fabrication step where RFICs, MMICs, and passive components are attached to the corresponding solder pads on a PCB, in accordance with one embodiment. During block 310 of the fabrication flow, shown in FIG. 6A, power dissipating components (e.g., active components such as RFIC's 706, GaN or GaAs MMIC's 708 and passive components such as capacitors 106) are attached to corresponding solder pads on the PCB 102. In certain embodiments, the power dissipating components are operably attached to the printed circuit board, enabling the ability to test and/or rework the circuit formed using these components before later attachment of the heat spreader. In one embodiment, the RFICs 706 and MMICs 708 are in bare chip form to minimize thermal resistance between chips and a heat sink (not shown in FIG. 6A). The RFIC's 706 and MMIC's 708 have solder balls 602a, 602b or solder bumps attached to pads on the circuit side of the chip. Alternatively, in certain embodiments, RFIC's 706 and MMIC's 708 can also be mounted into ball grid array or solder bump array packages, as long as there is a low resistance thermal path between the chip and the side of the package that is opposite to the solder side.

Figure 6B:
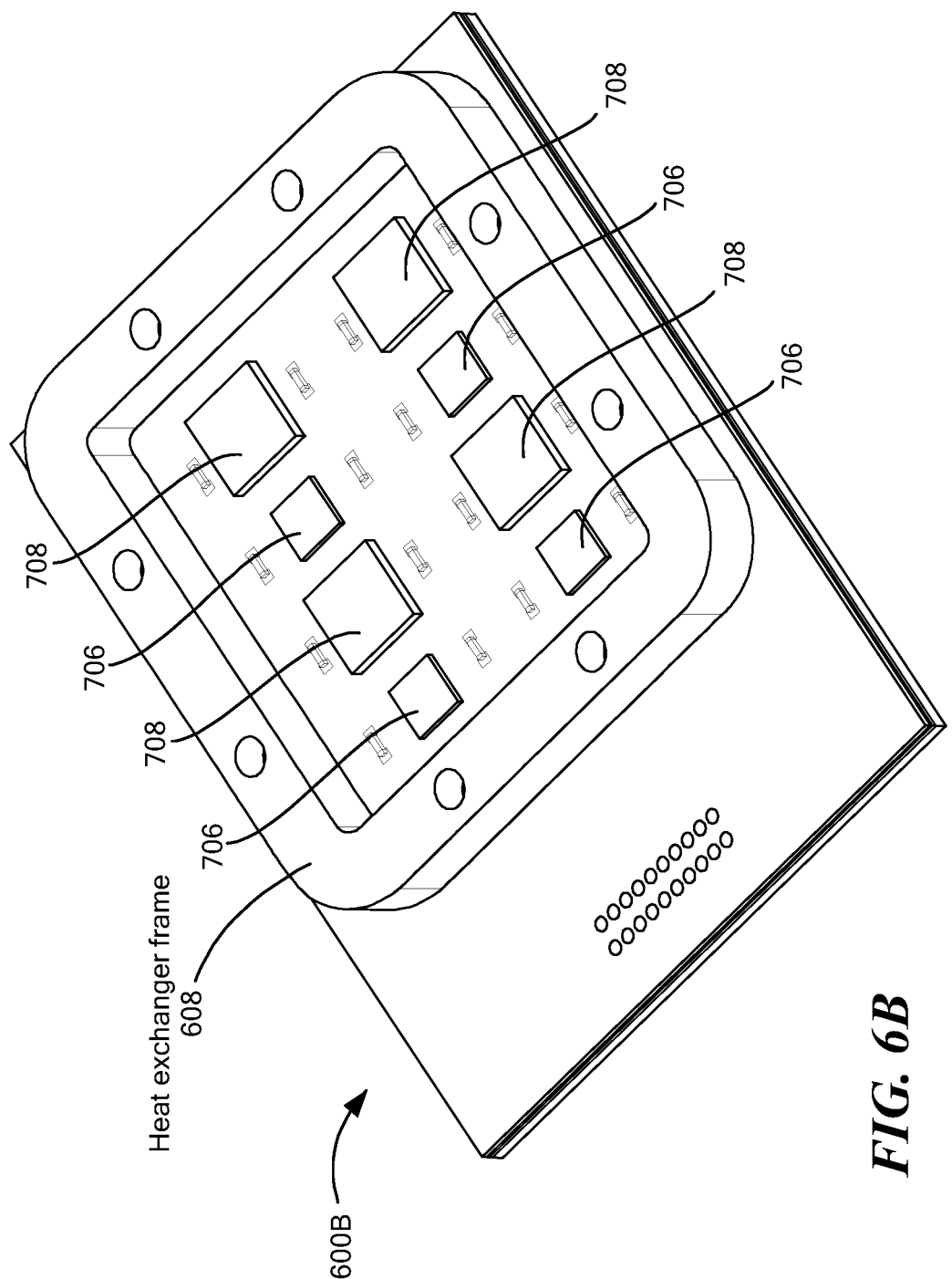
FIG. 6B is a perspective view of the same fabrication step as FIG. 6A, showing attachment of a heat exchanger frame to the PCB panel, in accordance with one embodiment.

Reference is now made to block 315 of FIG. 3A and also to FIG. 6B, which is a perspective view 600b of the same fabrication step as FIG. 6A, showing attachment of a heat exchanger frame 608 to the panel PCB 102, in accordance with one embodiment. The heat exchanger frame 608 is a structure configured to surround at least a portion of the heat generating components on the PCB 102, to define a first inner region containing one or more heat generating components, where the heat exchanger will be formed, and a second outer region, outside of the heat exchanger frame 608, defined by an outer boundary of the heat exchanger frame 608, where the heat exchanger is not formed outside the heat exchanger frame 608. In certain embodiments, the PCB board 102 has a solder trace formed along the first surface to define one or more locations on which to place the heat exchanger frame 608. The heat exchanger frame 608 is used to help form a heat exchanger (as further described herein) by electroplating a sheet of thermally and electrically conductive material to both the heat exchanger frame 608 and to a region that is enclosed by the heat exchanger frame 608, which region includes one or more heat generating components (as further explained herein). The sheet of thermally and electrically conductive material is configured to surround and embed the heat generating components so as to create a substantially void free interface between the heat exchanger and at least a portion of the heat generating components (advantageously, in certain embodiments, each heat generating component), while not interfering with operation of that component (because of the insulating underfill resin 702 discussed further below). The heat exchanger frame 608 can have any shape and need not be a continuous, integral structure (though in certain advantageous embodiments it is formed from a single, integral piece of an electrically and thermally conductive material, such as a metal material, an alloy, etc. In certain embodiments, the heat exchanger frame 608 can be formed using several pieces of material coupled together. In certain embodiments, the heat exchanger frame 608 can be formed using several pieces of material that together define a region therebetween, once coupled to the PCB 102, but which are not aligned to define the region until they are operably coupled and attached to the PCB 102.

A unique aspect to this embodiment is that the heat exchanger frame 608 is also attached to the pane PCB 102 at this fabrication step as shown in FIG. 6B. The heat exchanger frame 608, in certain embodiments, is made out of electrically conductive material, preferably a metal material. In addition, in certain embodiments, the material used for the heat exchanger frame 608 has good thermal conductivity, as well. In certain embodiments, the heat exchanger frames 608 is made using any electrically conductive material that is usable as a heat sink type of material, or any material having both electrical conductivity and a suitably high thermal conductivity (such as copper/aluminum alloys (CuAl), copper carbon nanotube composites (Cu—CNT), gold (Au), Silver (Ag), etc.). A solder reflow is performed after all components, including the heat exchanger frame 608 are placed on the board (block 317) to establish soldered bond between attached components and the board. In an alternate embodiment, the heat exchanger frame 608 can be attached separately after solder reflow and with low temperature adhesive; this technique may be advantageous in certain embodiments and applications, because use of low temperature adhesive may help to reduce issues associated with thermal coefficient mismatch between the PCB 102 and heat exchanger frame 608 during a high temperature solder re-flow step. The shape of the heat exchanger frame 608 shown is illustrative and not limiting. The heat exchanger frame 608 can have any desired shape or outline so long as it is configured to enclose a desired portion of active and/or passive components which require cooling and over which a heat exchanger, as described herein, can be formed. In certain embodiments, the heat exchanger frame 608 is configured to form a continuous perimeter defining any desired shape, regular (e.g., circular, square, oval, rectangular, triangular, etc.) or irregular, so long as the processes described in the blocks of FIGS. 3A-3B, are able to be performed. In certain embodiments, the heat exchanger frame 608 is configured to form a perimeter that is not 100% continuous, but which is able to have one or more openings or gaps in the perimeter, so long as the heat exchanger frame 608 is still able to form a tight, leak free and void free seal to the heat dissipating components that are enclosed within the area defined by the frame. In certain embodiments, the gaps between the non-continuous frame portions, are processed similar to the areas outside the frame and end up not being electroplated if they are (eventually) coated with the second temporary protective insulating resin as described further herein. In certain embodiments, gaps between the non-continuous frame portions may be configured to not receive the second temporary protective insulating resin, and thus be electroplated, as described herein.

Figure 7:
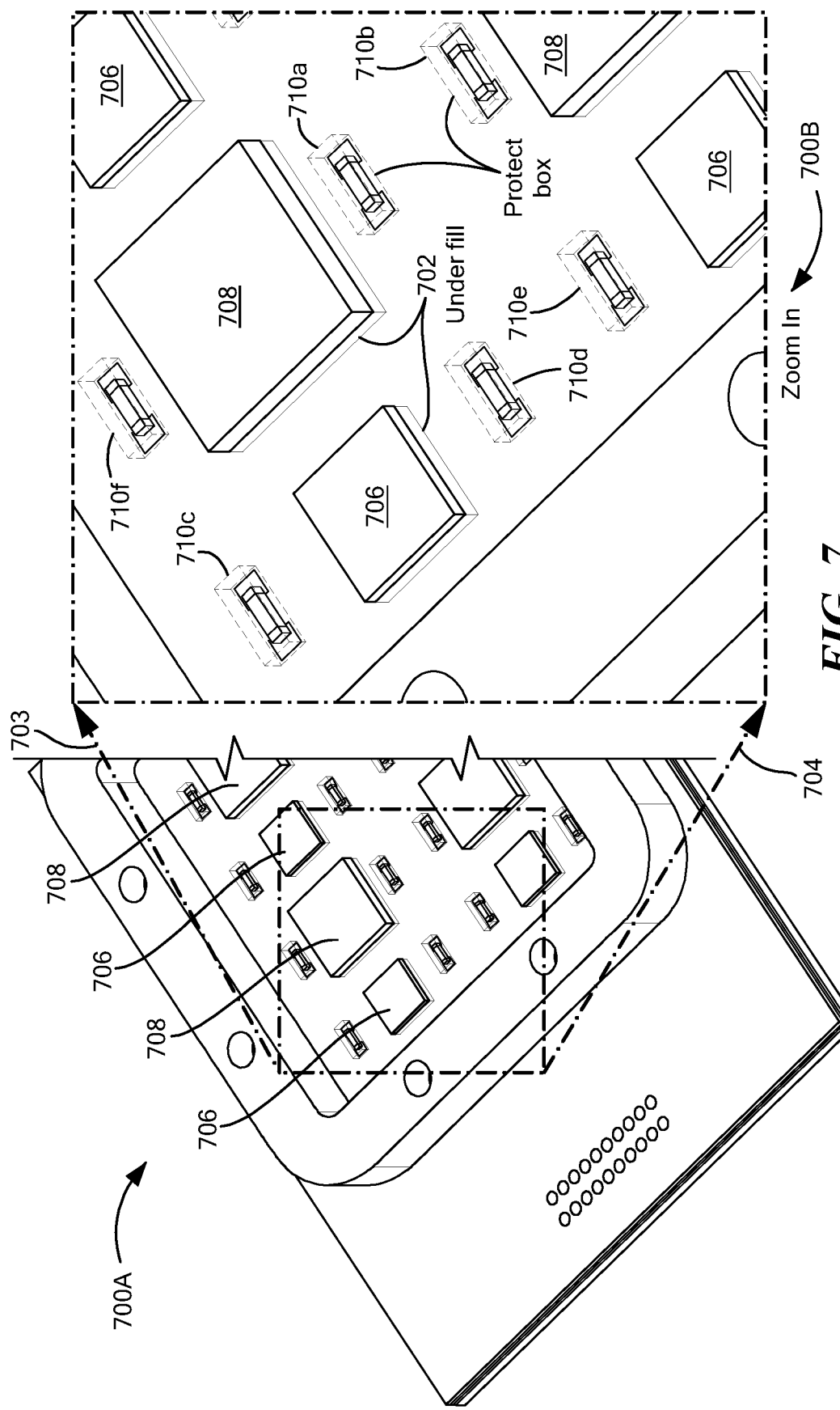
FIG. 7 includes two enlarged perspective views of the heat exchanger frame of FIG. 6B, showing details after underfill and protect box deposition, in accordance with one embodiment.

FIG. 7 includes two enlarged perspective views 700A, 700B, respectively, of the heat exchanger frame of FIG. 6B, showing details after underfill and protect box deposition, in accordance with one embodiment. The Zoom In view 700B is an enlarged view of the area indicated by arrows 703, 704.

Figure 8A:
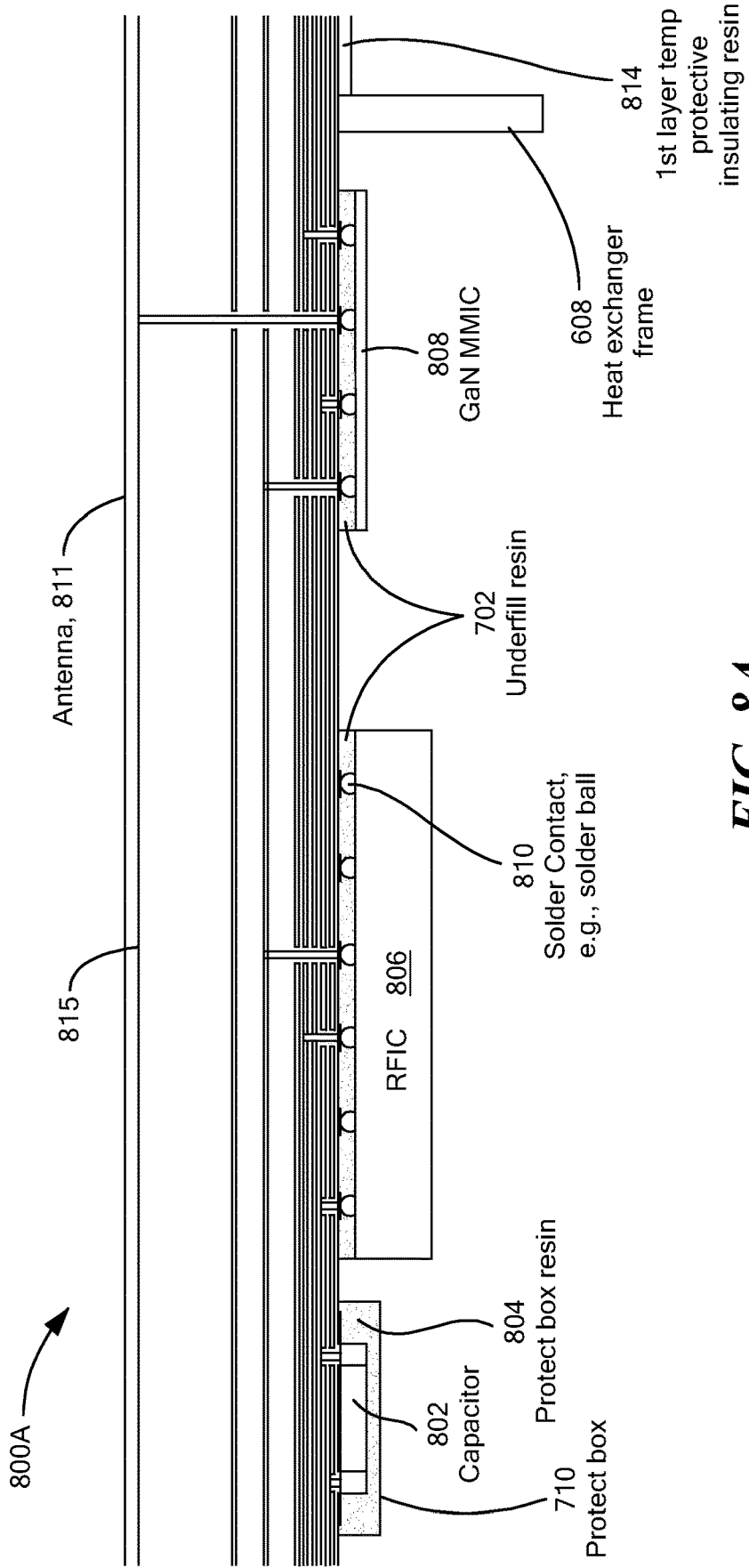
FIG. 8A is a cross sectional view of the AESA board panel of FIGS. 6A-7, after underfill, protect box deposition, and first temporary protective resin are applied, in accordance with one embodiment.

FIG. 8A is a cross-sectional view 800A of the AESA board panel of FIGS. 6A-7, after underfill 702 deposition and protect box 710 deposition (and also applying a first layer of temporary protective resin 814, discussed further below), in accordance with one embodiment.

Referring to FIGS. 3A, 7, and 8A, after the attaching the heat exchanger frame (block 315), the space between the mounted components (e.g., components 706, 708, such as RFIC 806 and GaN MMIC 808) and the board panel PCB 102, is completely filled with an electrically insulating material, such as an underfill resin 702 (block 320). In certain embodiments, the underfill resin 702 is an electrically insulating resin material, such as organic resin, alkyd resin, polycarbonate resin, epoxy resin, polyurethane resin, polyethylene resin, or polystyrene resin, or BCB resin, but this is not limiting. Another example of a usable electrically insulating resin is 3M SCOTCH CAST resin, but this also is not limiting. In certain embodiments, the underfill resin 702 is applied so that it only covers the solder contacts of components such as RFICs 806 and MMICS 808, as shown in FIG. 8A, and the underfill resin 702 does not cover the heat exchanger frame 608. That is, the heat exchanger frame 608 is not covered by any protective coating, as shown in FIG. 8.

In addition, in certain embodiments, all passive components (e.g., resistors, capacitors, etc.) having metal not completely covered by underfill resin 702 (e.g., capacitor 802) are encapsulated with a protective structure (here termed a "protect box") 710 (block 323), wherein the protective structure is made of electrically insulating protective resin 804, as shown via the exemplary dotted line boxes 710a-710f in FIG. 7 and the dotted line protective box 710 in FIG. 8A, which encapsulates capacitor 802 with protective resin 804. Various methods are usable to create the protective structure, including an automated needle point nozzle dispenser. The material used for the underfill resin 702, in certain embodiments, can be the same as the material used for the protective resin 804, but this is not limiting. In certain embodiments, it may be advantageous for the protective resin 804, if the same material as the underfill resin 702, to be a material with a higher viscosity to achieve thick enough coverage over passive components to prevent electrical shorts. For example, in some embodiments, the protective resin 804 is a reformulated type of the material used as the underfill resin 702. In other embodiments, the protective resin 804 can be any of the above-listed material described as being usable for the underfill resin 702. As those of skill in the art will appreciate, additional types of resins also are usable. For example, the material used as protective resin 804 can include materials that are ultraviolet (UV) light curable, as such a material can be readily exposed by UV light during manufacture, unlike underfill resin 702 under components, which is obscured from UV light.

It will also be understood that the protective structure 710 need not have a "box" shape but can in fact have any shape suitable to enclose the passive component in an electrically insulating material and protect the passive component from being electroplated (in later steps) with a thermally and electrically conductive material. In certain embodiments, the underfill resin 702 is a different electrically insulating resin material than the protective resin 804, though both the underfill resin 702 and the protective resin 804, are electrically insulating resin materials. In certain embodiments, components such as RFIC's 806 and MMICs 808 have all their solder contacts 810 protected by underfill resin 702 and are not otherwise covered by a protect box 710 to minimize thermal resistance between chip die and the heat exchanger as shown in FIGS. 7 and 8A.

Referring to FIGS. 3A and 8A, after the underfill resin 702 (block 320) and protective box 710 with protective resin 804 (block 323) are applied, all surface areas of the PCB 102 that are not enclosed by the heat exchanger frame 608 are coated by a first layer of temporary protective material, such as an insulating resin (block 325), while the heat exchanger frame 608 and the board area enclosed by the heat exchanger frame 608 are left exposed (the heat exchanger frame 608 is not covered by any protective coating or resin, as shown in FIG. 8A). In addition, the front side 811 (antenna side) (FIG. 8A) is also protected, in block 325, by a front layer 815 of temporary protective resin or temporary adhesive tape. As those of skill in the art will appreciate, because the front side 811 of the PCB is substantially flat, a protective material such as tape can work well to form a protective layer as a front layer 815 with good contact to the front side 811. As shown in the cross-sectional view 800A of FIG. 8A, the area not enclosed by heat exchanger frame 608 is the area to the right of heat exchanger frame 608 in FIG. 8A, the area where the first layer of temporary protective resin 614 is shown in cross-sectional view. The first layer of temporary protective resin 614 is made of an electrically insulating material. In some embodiments, the first layer of temporary protective resin 814 is a spun-on insulating polymer material. For example, in some embodiments, the first layer of temporary protective resin 814 comprises an easily solvable resin, such as an optical lithography photoresists, which is advantageous for temporary protection as it is more easily removed than some other resins. In certain embodiments, the first layer of temporary protective resin 814 can be almost any type of resin that is easily removed by solvent; examples of such resins that are usable as the temporary protective resin 814 include, but are not limited to, are polydimethylglutarimide (PMGI) resist and lift off resist (LOR) resist, such as those available from KAYUKU Advanced Materials of Westborough, Massachusetts. As those of skill in the art will appreciate, there are many low-cost resins that are easily removed by solvent and that are usable as the first layer of temporary protective resin 814. In some embodiments, the first layer of temporary protective resin 814 is applied selectively with an automated dispenser, instead of via a spin on technique. In some embodiments, a combination method is used: dispensing the first layer of temporary protective resin 814 outside the outer periphery of the frame (as shown in FIG. 8A) and then spinning the PCB 102 to remove excess first layer of temporary protective resin 814. The second protective resin 818 (discussed further below) can be applied the same way. This first layer of temporary protective resin 814 is applied in block 335 to help ensure that the later-applied conductive plating membrane (block 330) and electroplated material (block 340) are prevented from adhering to other parts of the PCB 102, because such conductive materials could, of course, short out other components or conductive areas of the PCB 102.

In addition, because insulating underfill resin 702 is applied under the mounted components to cover the exposed solder contacts 810, (including those for components on the PCB 102, such as the RFICs, MMICs enclosed by the heat exchanger frame 608), the solder contacts 810 will be protected and insulated from both the conductive plating membrane 816 to come (see FIG. 8B discussed below) and the electroplating to come (see FIG. 10A discussed below) and will not be shorted out. Similarly, because the protective resin 804 is applied around passive components such as the capacitor 802, the operation of those components also will not be impacted by the conductive plating membrane 816 and electroplated conductive material that is to be applied.

Figure 8B:
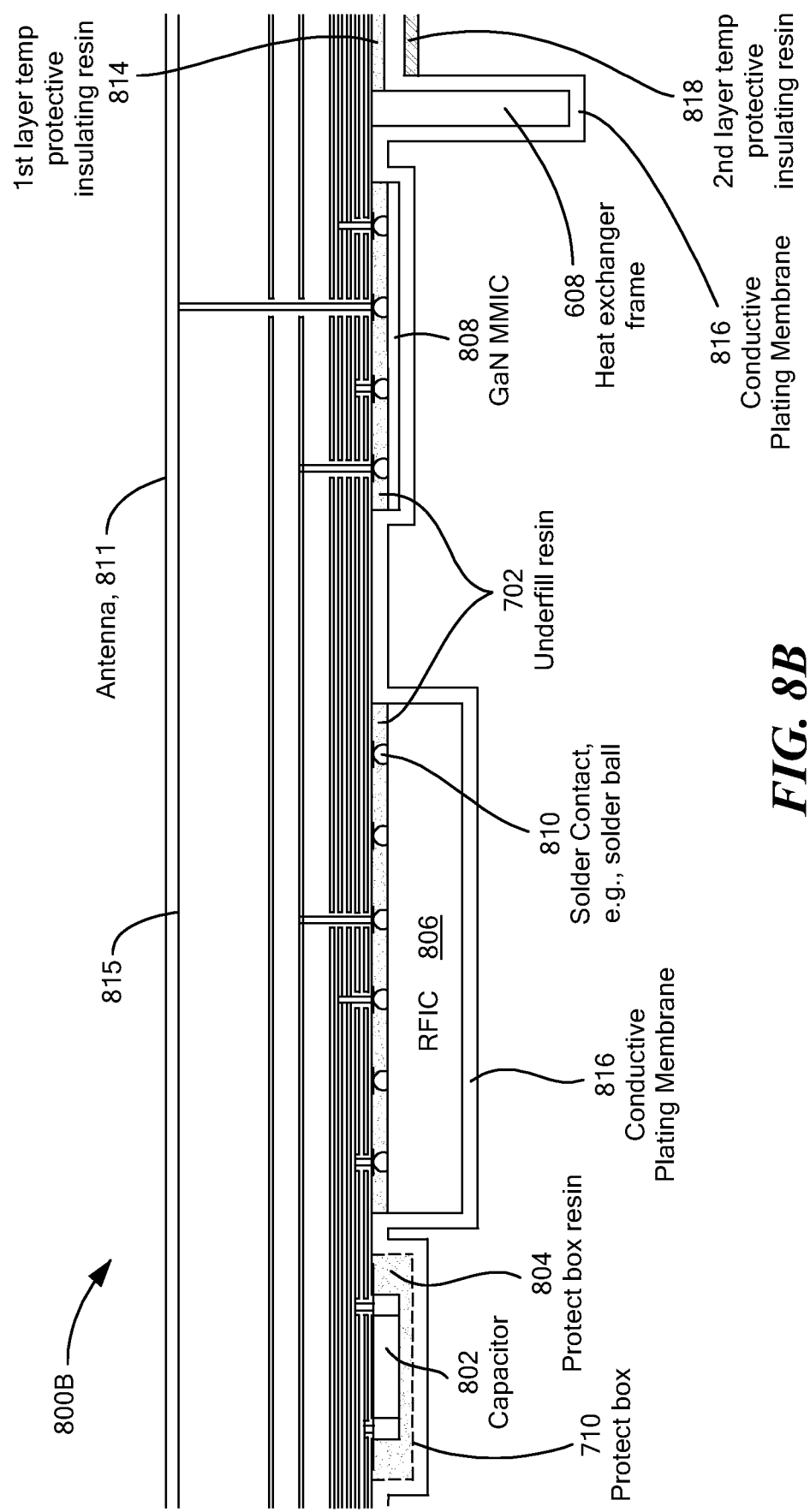
FIG. 8B is a cross-sectional view of the AESA board panel of FIG. 8A after application of the conductive plating membrane and a second layer of temporary protective resin, in accordance with one embodiment.

Referring again to FIG. 3A, in block 330, a conductive plating membrane 816 (also known in the art as a seed metallic layer) is deposited over the backside of the PCB 102, and this deposition can be accomplished via various methods, including but not limited to sputtering or by atomic layer deposition. FIG. 8B is a cross-sectional view 800A of the AESA board panel of FIG. 8A after application of the conductive plating membrane 816, in accordance with one embodiment (and also after application of a second layer of temporary protective resin 818, described further herein). The conductive plating membrane 816 is not shown to scale but is shown larger for purposes of illustration. The conductive plating membrane 816 contacts the entire back side of the PCB 102, including covering areas coated with the first layer of temporary protective insulating resin in block 325, areas enclosed by the heat exchanger frame 608, areas outside of the heat exchanger frame 608, and the heat exchanger frame itself.

As will be further described herein, being able to electroplate metallic material onto the non-metallic surfaces, while continuing the electroplating all the way to the heat exchanger frame 608, helps to construct a form-fitted heat exchanger that creates a void-free thermal interface between active components and the form-fitted heat exchanger.

In certain embodiments, the conductive plating membrane 816 is a metallic membrane having a thickness on the order of 20 nm to 1 micron thick. Examples of materials usable for the conductive plating membrane include, but are not limited to, films made using a combination of several metals, such as, Tantalum (Ta)/Cu stack, Tantalum Nitride (TaN)/Cu stack, a Titanium (Ti) film, a Ti/Au stack, Ti stacks with other metals (e.g., Ti/Cu), Ni/Cu stack and the like.

Referring again to FIG. 3A and FIG. 8B, in block 335, the conductive plating membrane 816 is than covered by a second layer of temporary protective resin 818 over the same areas where temporary protective resin was applied prior to plating membrane deposition (i.e., over the first layer of temporary protective resin 814) (block 335). Thus, because the first layer of temporary protective resin 814 was applied to areas not enclosed by the heat exchanger frame 608, the second layer of temporary protective resin 818 likewise is applied to areas not enclosed by the heat exchanger frame 608, so as to cover the portion of the layer of conductive plating membrane 816 that overlays those areas.

Referring again to FIG. 3A, in block 340, the AESA board panel PCB 102 (also referred to herein as PCB 102) is then transferred into electroplating bath (e.g., a solution containing ionic species (plateable ions of an electrically conductive material, such as a metal like copper (Cu), as is understood in the art). During the electroplating process (sometimes referred to in the art as an electrodeposition process), an electrically conductive metal sheet is electroplated over exposed areas of the conductive plating membrane 816, to produce an electrically and thermally conductive metallic coating or continuous sheet over these areas, via the action of applying an electric current to a conductive material (also referred to as a plateable material) immersed in a solution containing a salt of the metal to be deposited. The electroplating of block 340 is configured to couple a continuous sheet of an electrically and thermally conductive material to the heat exchanger frame 608, the components surrounded by the heat exchanger frame 608, and the region of the PCB 102 enclosed by the heat exchanger frame 608. As shown, e.g., in FIG. 9A (discussed herein), the continuous sheet of electrically and thermally conductive sheet 902 of material, when mechanically/chemically coupled to the heat exchanger frame 608, forms a void-free heat exchanger. This heat exchanger makes void free contact with top surfaces of the heat dissipating components (e.g., the RFIC 806 and the MMIC 808s) and void free contact with the protect box 710, as part of the continuous sheet.

The areas of the conductive plating membrane 816 that are not exposed (i.e., the areas coved by the second layer of temporary protective insulating resin 818) are prevented from being electroplated during the immersion in the electroplating bath, because there is not a metallic surface with which the ions in the electroplating bath can react, as will be understood.

As is understood in the art, the electroplating bath may contain, in addition to the plateable metal ions, other electrolytes, surfactants, and/or other additives well known in the art, such as brighteners, levelers, and/or accelerators. Further, as is known in the art, the electroplating bath solution can be of one composition, or can change composition during the electroplating process. The electroplating bath solution, in some embodiments, can comprise salts of metal ions or complex metal ions and other ingredients, for example acids or bases, buffers, surfactants and/or other additives known in the electroplating art. The plateable metal in the electroplating solution can have either a positive charge or a negative charge, as will be understood.

Figure 9A:
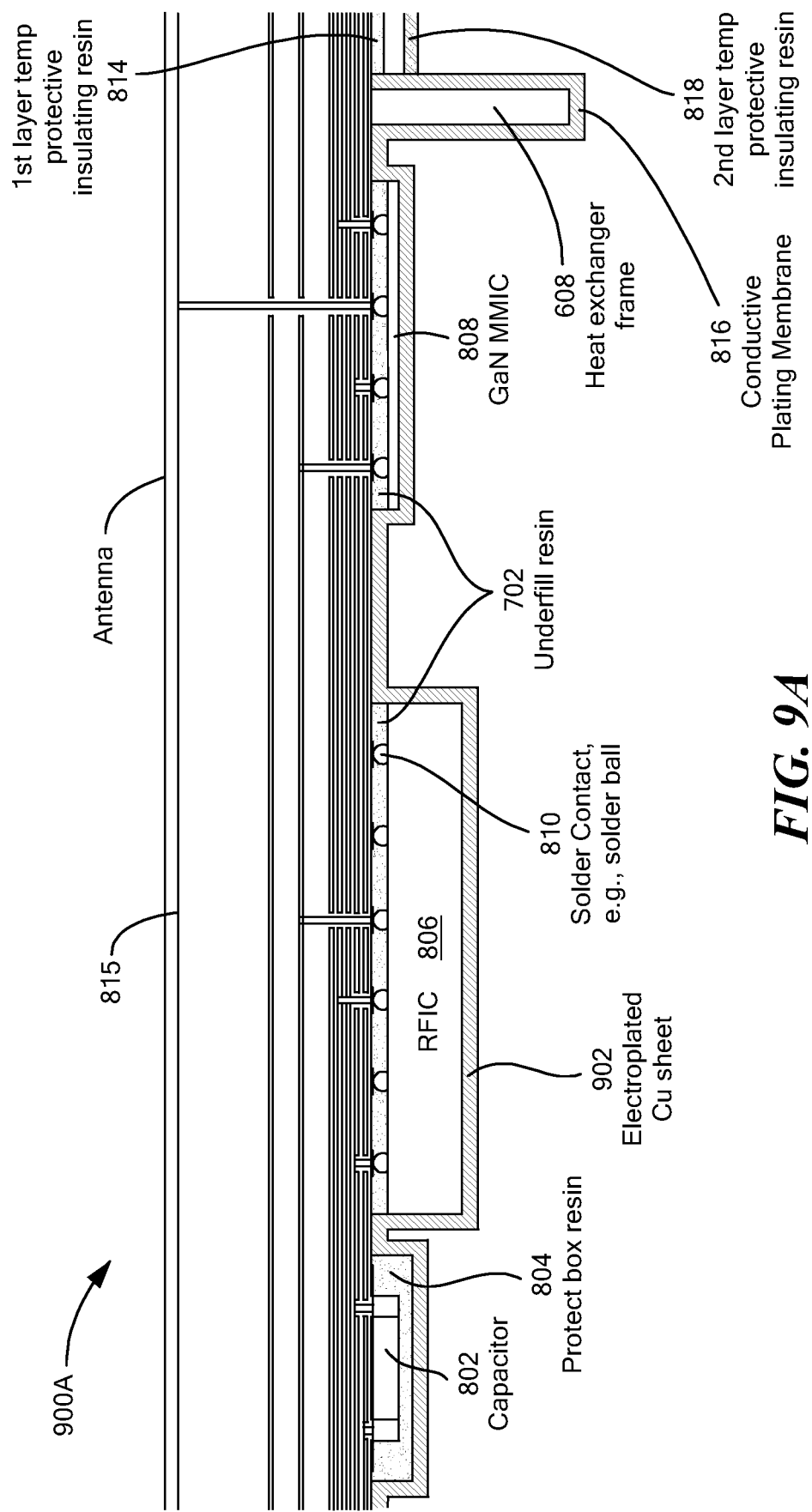
FIG. 9A is a cross-sectional view of the AESA board panel of FIG. 8B, after electroplating and before removal of first and second temporary protective resins and before removal of exposed plating membrane, in accordance with one embodiment.

FIG. 9A is a cross-sectional view 900A of the AESA board panel of FIG. 8B, after the electroplating of block 540 and before removal of the first temporary protective resin 814, the exposed conductive plating membrane 816, and the second layer of protective insulating resin 818, in accordance with one embodiment.

In certain embodiments, the electrically conductive metal sheet that is applied in block 340, is a 100 μm to a 200 μm thick copper (Cu) metal sheet, but this material is not limiting, as those of skill in the art will appreciate. Other materials (e.g., metals, alloys) with good electrical conductivity and which can be electroplated, such as silver, gold, nickel, and tin (Sn), also are usable for electroplating using the electroplating bath, as will understood.

Figure 9B:
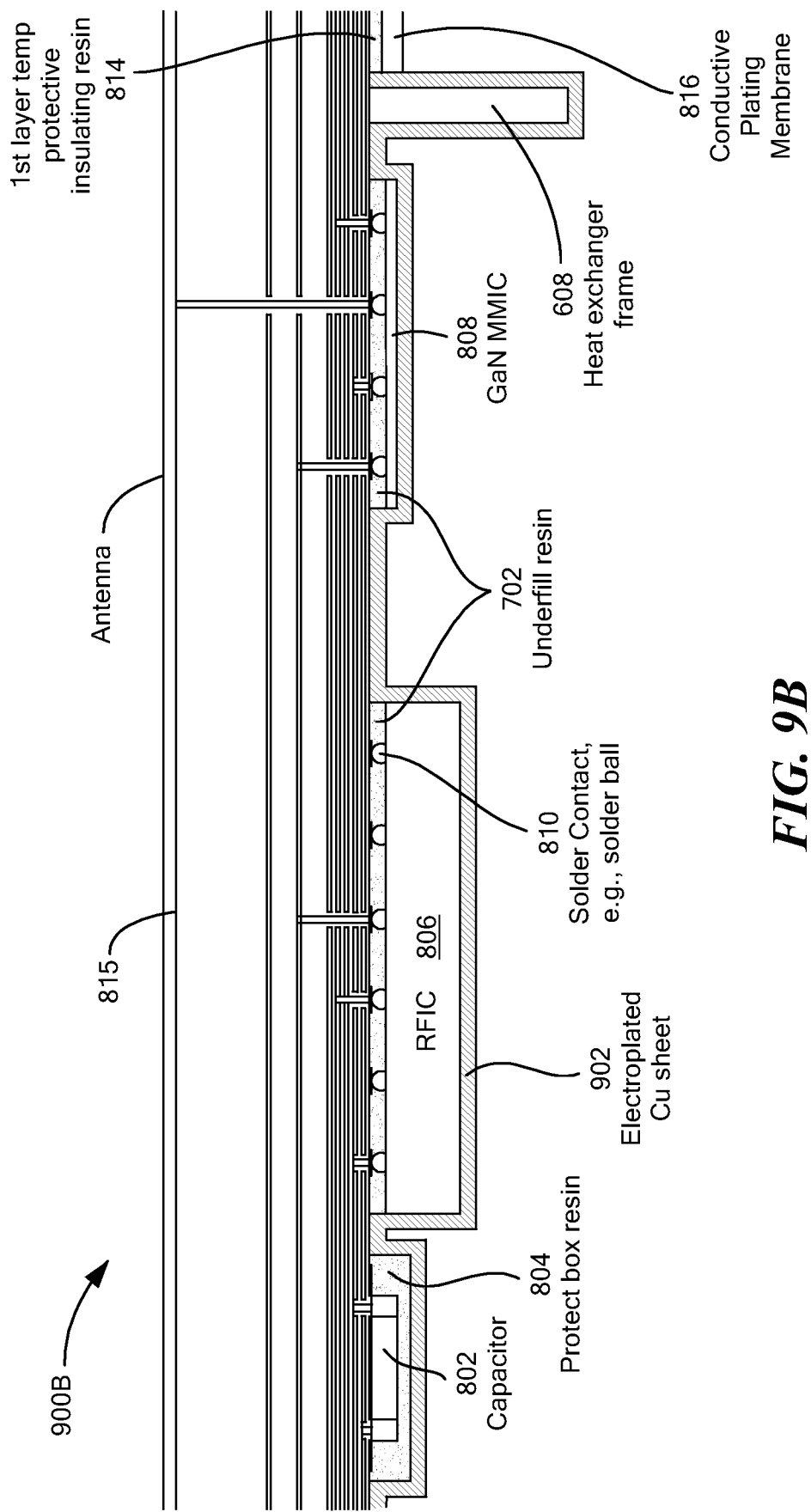
FIG. 9B is a cross-sectional view of the AESA board panel of FIG. 9A, after removal of the second layer of temporary protective resin, in accordance with one embodiment.

After the electroplating of block 340 is complete, the following steps are performed in a sequence, to remove the second layer of temporary protective resin 818, the exposed conductive plating membrane 816, and the first layer of temporary protective insulating resin 814. In block 345, the second layer of temporary protective resin 818 is removed, e.g., using a method appropriate to the particular materials used for the second layer of protective insulating resin, such as a solvent. Removal of the second layer of temporary protective resin 818 exposes portions of the conductive plating membrane 816 that were previously protected by the second layer of temporary protective resin 818. FIG. 9B is a cross-sectional view 900B of the AESA board panel of FIG. 9A, after removal of the second layer of temporary protective resin 818, showing the exposed portion of conductive plating membrane 816, that was previously protected.

Figure 9C:
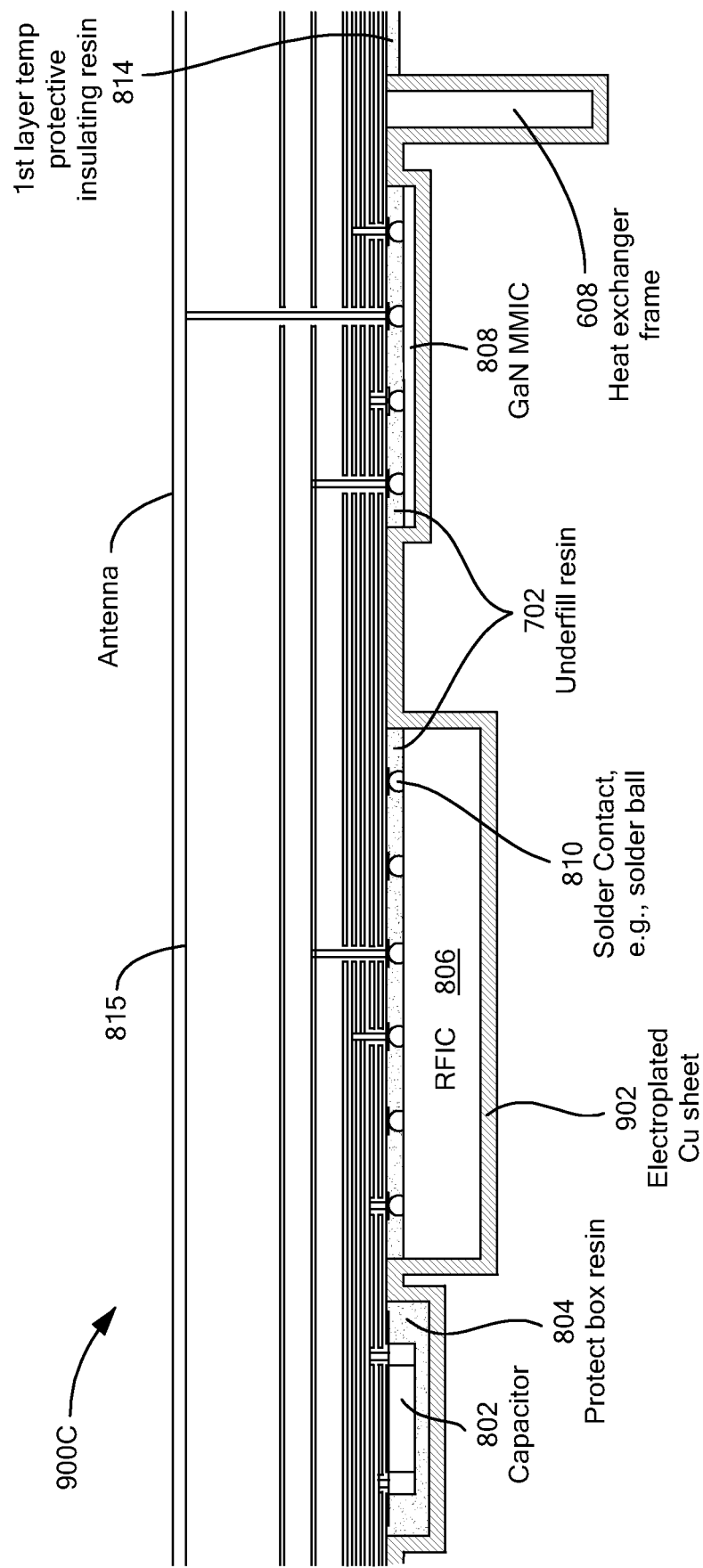
FIG. 9C is a cross-sectional view of the AESA board panel of FIG. 19B, after removal of the exposed conductive plating membrane, in accordance with one embodiment.

In block 350, the exposed portion of conductive plating membrane 816 is removed. This removal can be accomplished in various ways known in the art, including but not limited to using a solvent, by ion milling, by dry etching, etc. Top temporary protective resin is removed, exposing protected portion of the plating membrane. FIG. 9C is a cross-sectional view 900C of the AESA board panel of FIG. 9B, after removal of the exposed conductive plating membrane 816, in accordance with one embodiment.

Figure 9D:
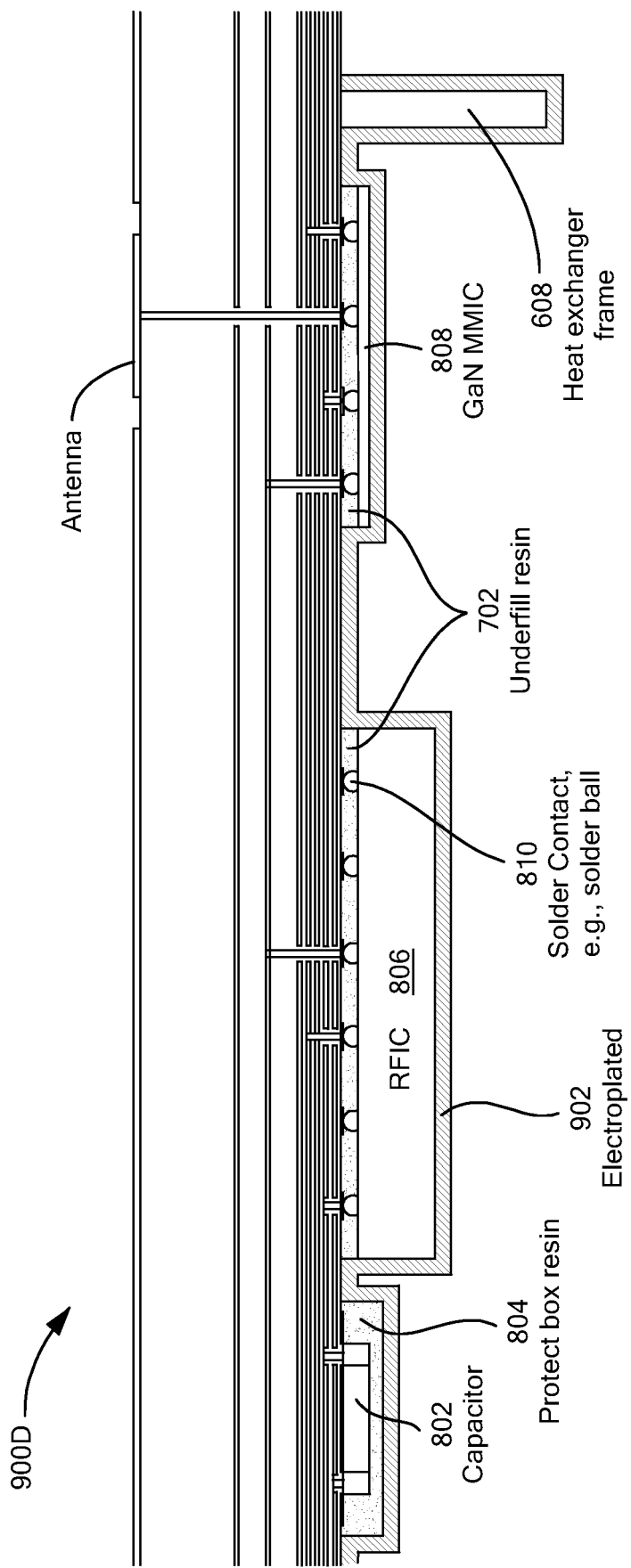
FIG. 9D is a cross-sectional view of the AESA board panel of FIG. 9C, after removal of the first layer of temporary protective resin, in accordance with one embodiment.

The method shown in FIG. 3A then continues to FIG. 3B, which is a second part of a detailed process for manufacturing the AESA panels of FIGS. 4-15D, in accordance with one embodiment. Referring to FIG. 3B, in block 355, the first layer of temporary protective resin 814 is removed (e.g., using a solvent), and the temporary protective layer (front layer 815) on the front side 811 (e.g., resin or tape, as described above) also is removed in block 355. This completes the conductive metal electrodeposition or electroplating process. FIG. 9D is a cross-sectional view 900D of the AESA board panel PCB 102 of FIG. 9C, after removal of the first layer of temporary protective resin 814, in accordance with one embodiment, and FIG. 10 is a perspective view 1000 of the AESA board panel PCB 102 of FIG. 9C, after completion of the conductive metal electrodeposition process, in accordance with one embodiment.

Figure 10:
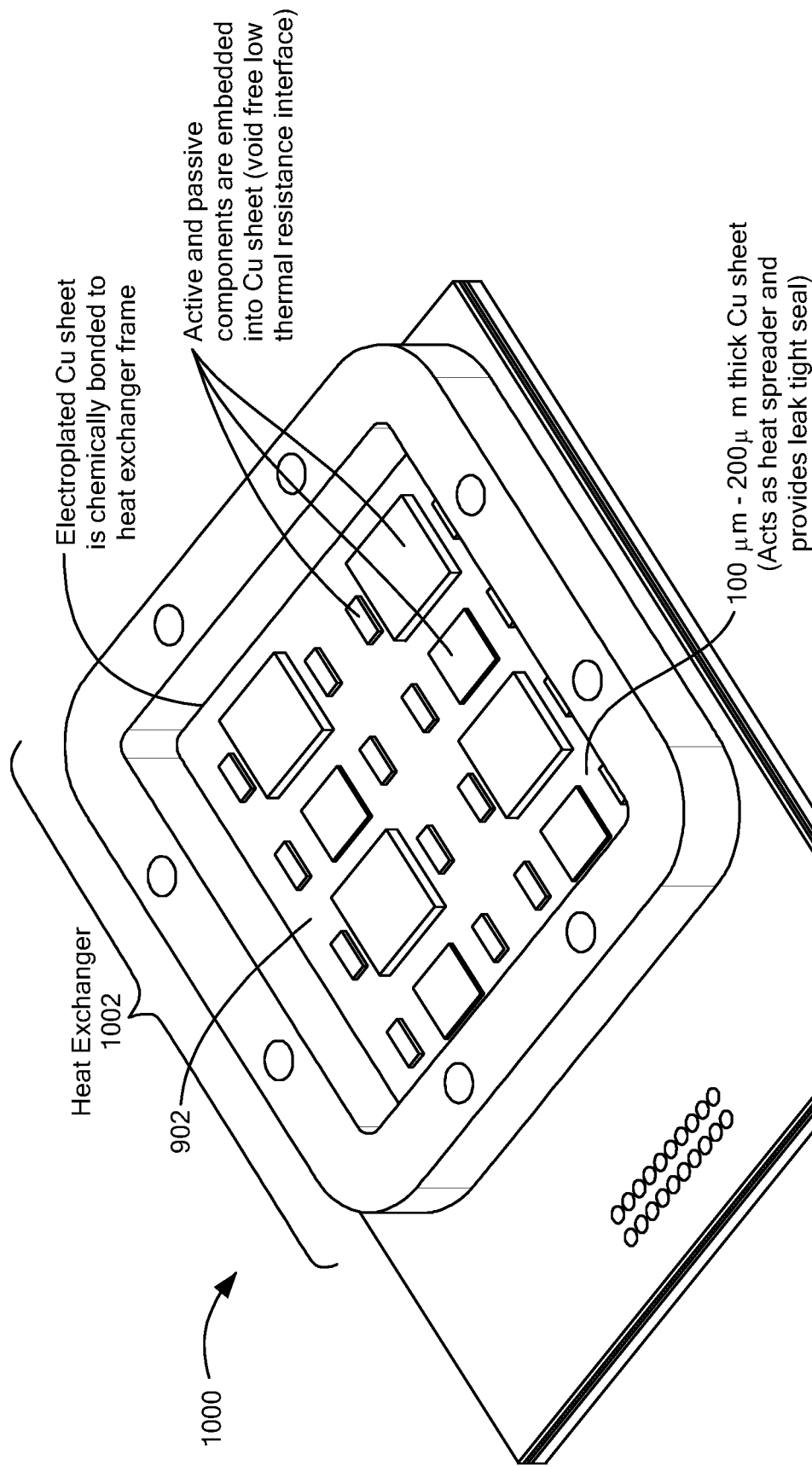
FIG. 10 is a perspective view of an AESA board panel after completion of a conductive metal electrodeposition process, accordance with one embodiment.

As can be seen in FIGS. 9D and 10, the electroplated electrically and thermally conductive sheet 902 (e.g., a metal sheet, such as Cu) is chemically bonded to the heat exchanger frame 608 and is an integral part of the heat exchanger 1002 that is formed. FIGS. 9D and 10 also show how active components are embedded into the electroplated metal (e.g., Cu) sheet, resulting in a void free low thermal resistance interface. The electroplated electrically and thermally conductive sheet 902 acts as a heat spreader and provides leak tight seal that separates chips from a heat exchanger cooling medium (discussed further herein). FIGS. 9D and 10 also illustrate, in certain embodiments, that there is a continuous and unbroken thermally and electrically conductive, and void free, connection between all sides of the heat exchanger frame 608 and across all of the active and passive components of the AESA board panel PCB 102, such that the active and passive components (e.g., the RFIC 806, the MMIC 808, the capacitor 802, etc.) are embedded into the electroplated electrically and thermally conductive sheet 902, where the electroplated electrically and thermally conductive sheet 902 also is chemically and mechanically bonded to the heat exchanger frame 608 (as a result of the electroplating process).

As will be appreciated by those of skill in the art, the continuous connection from edge to edge of the heat exchanger frame 608, with the contained components embedded into the electroplated electrically and thermally conductive sheet 902, effectively forms a heat exchanger 1002 (which is the joined combination of the heat exchanger frame 608 and the continuous sheet of metal 902 in which the components are embedded). The heat exchanger 1002 that is formed in this manner helps to provide a tight leak seal between the heat exchanger 1002 and the active components and, hence, enables implementation of highly effective heat extraction techniques such as: forced flow liquid cooling, forced flow liquid-vapor dual phase cooling, and/or heat extraction by phase change of fusible material, as referred to further below.

In step 5 of the fabrication process connectors for DC bias, communication controls and RF interface are attached to the AESA panel. FIG. 9. shows AESA board panel after connector attach step.

Figure 11:
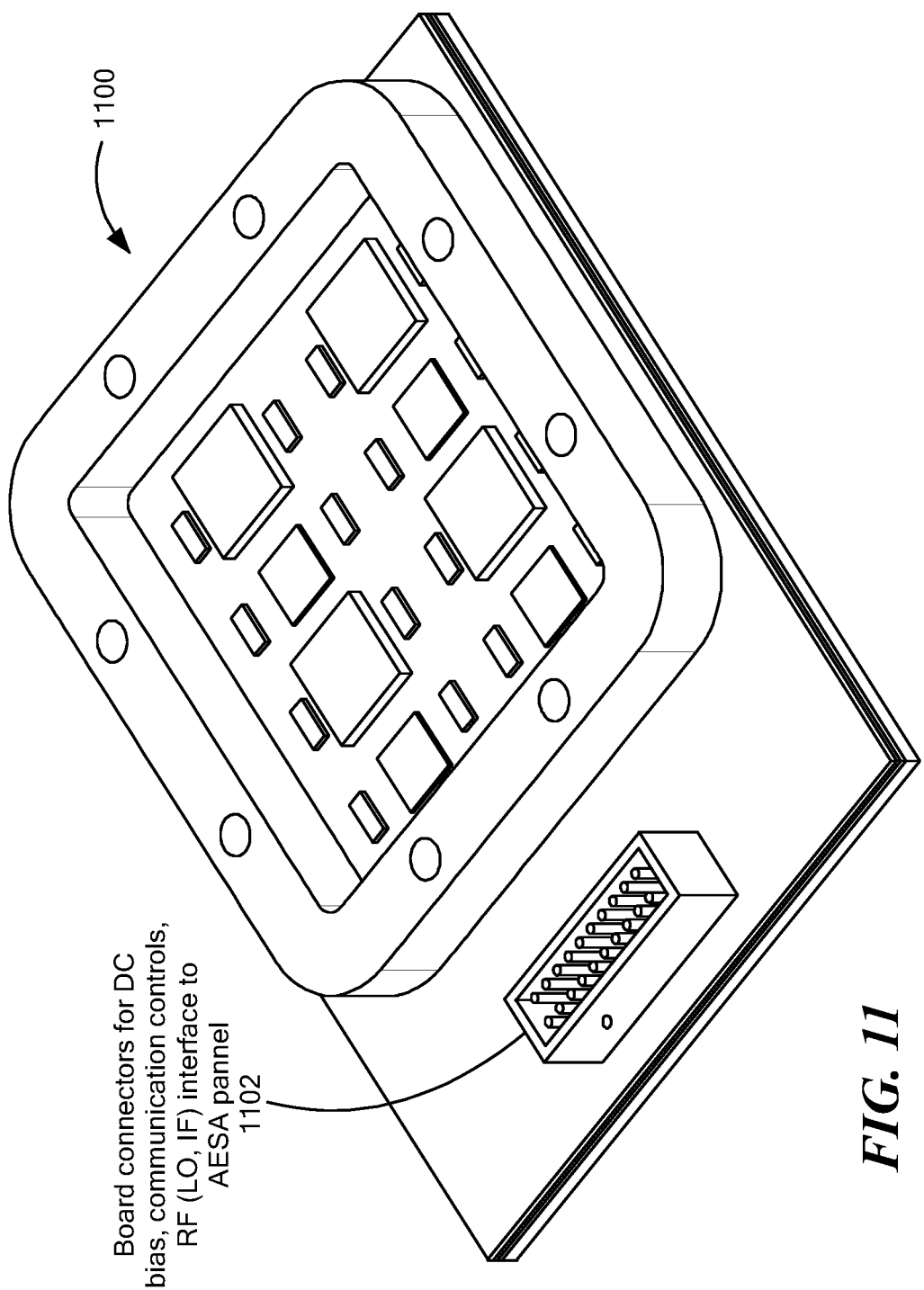
FIG. 11 is a perspective view of the AESA board panel of FIG. 9 after a connector attachment step, in accordance with one embodiment.

Referring again to FIG. 3A, in block 360 of fabrication process, AESA board connectors 1102 (e.g., connectors for DC bias, communication controls, and a radiofrequency (RF) interface) are attached to the AESA panel PCB 102. FIG. 11 is a perspective view 1100 of the AESA board panel PCB 102 of FIGS. 9D and 10 after a connector attachment step, in accordance with one embodiment. In block 365 of fabrication, the final assembly of the heat exchanger 1002 is performed. In certain embodiments, two versions or options for adding cooling to the heat exchanger 1002, can be fabricated, as shown by a first "version 1" path (blocks 370, 375, 380) and a second "version 2" path (blocks 385, 387, 389, 391, and 395). Each version is described further below.

The version 1 path, in certain embodiments, results in creation of a heat exchanger 1002 that uses forced flow cooling (block 370), which can be useful for AESA systems that are operating continuously over long periods of time. In block 375, a manifold 1202 for forced flow liquid or for forced flow liquid/vapor dual phase cooling is attached to the heat exchanger frame 608 using fastening screws 1204 as shown in FIGS. 12A-12F, which are perspective views 1200a-1200f, respectively that show an exemplary implementation and stack up to form a cooling manifold 1202 for the AESA board panel of FIG. 11. The stack up of the cooling manifold 1202 is configured so that supply nozzles are placed over the active components, in accordance with one embodiment.

Figure 12A:
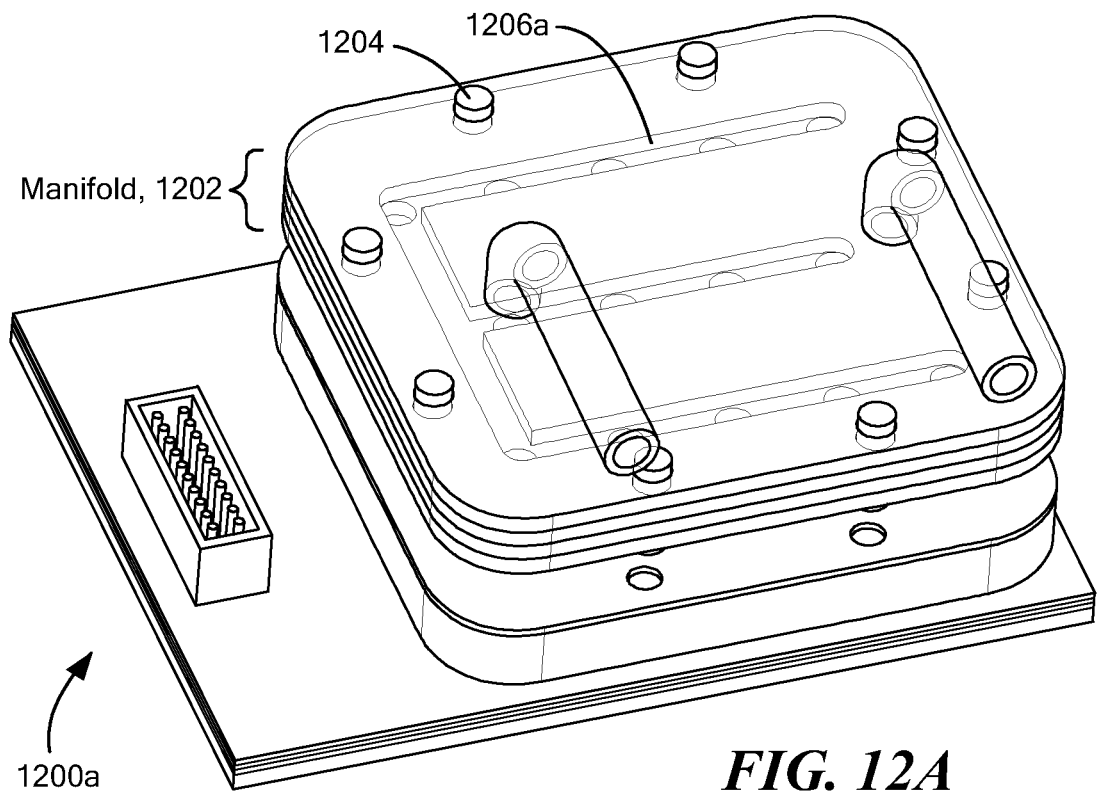
FIGS. 12A-12F are perspective views 1200a-1200f, respectively that show an exemplary implementation and stack up to form a cooling manifold for the AESA board panel of FIG. 11, where the stack up is configured so that supply nozzles are placed over the active components, in accordance with one embodiment.
Figure 12B:
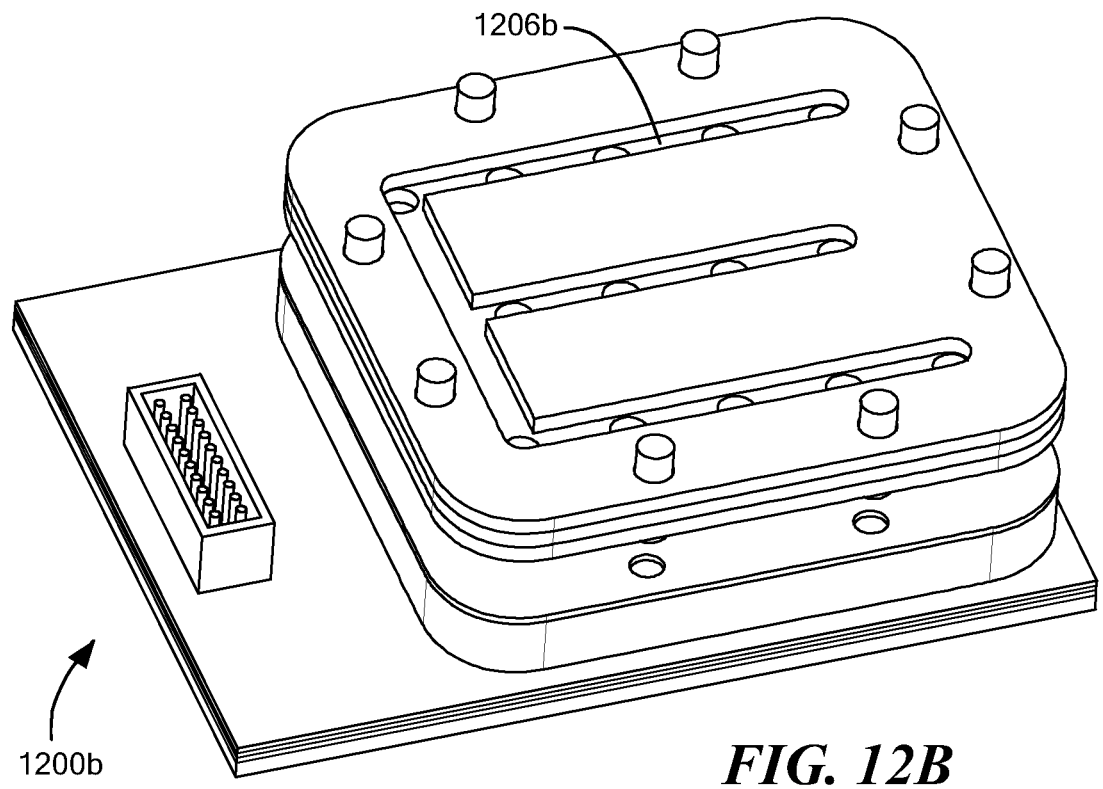
Figure 12C:
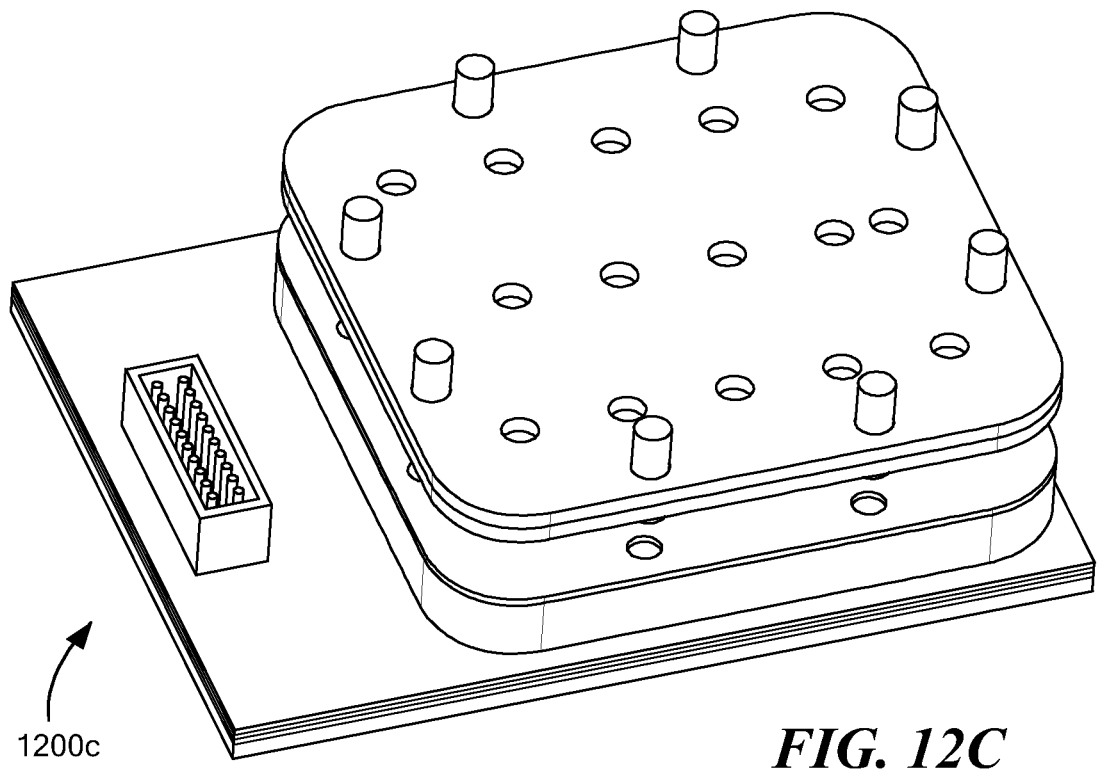
Figure 12D:
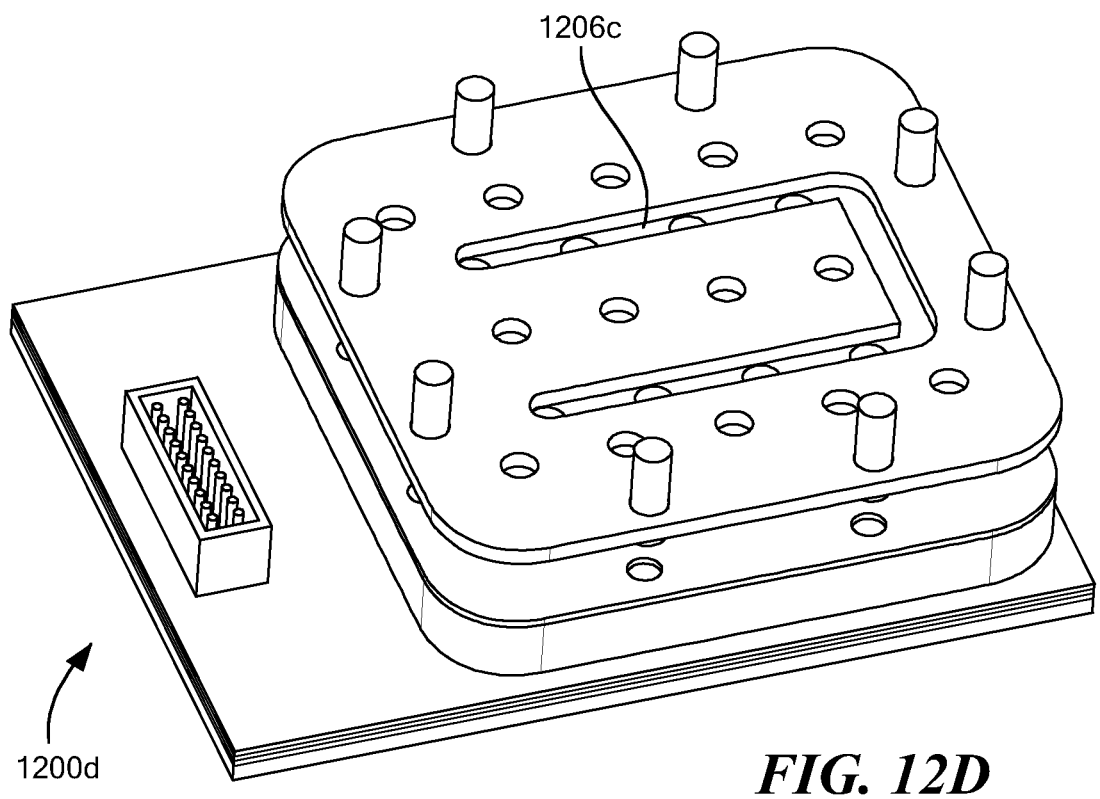
Figure 12E:
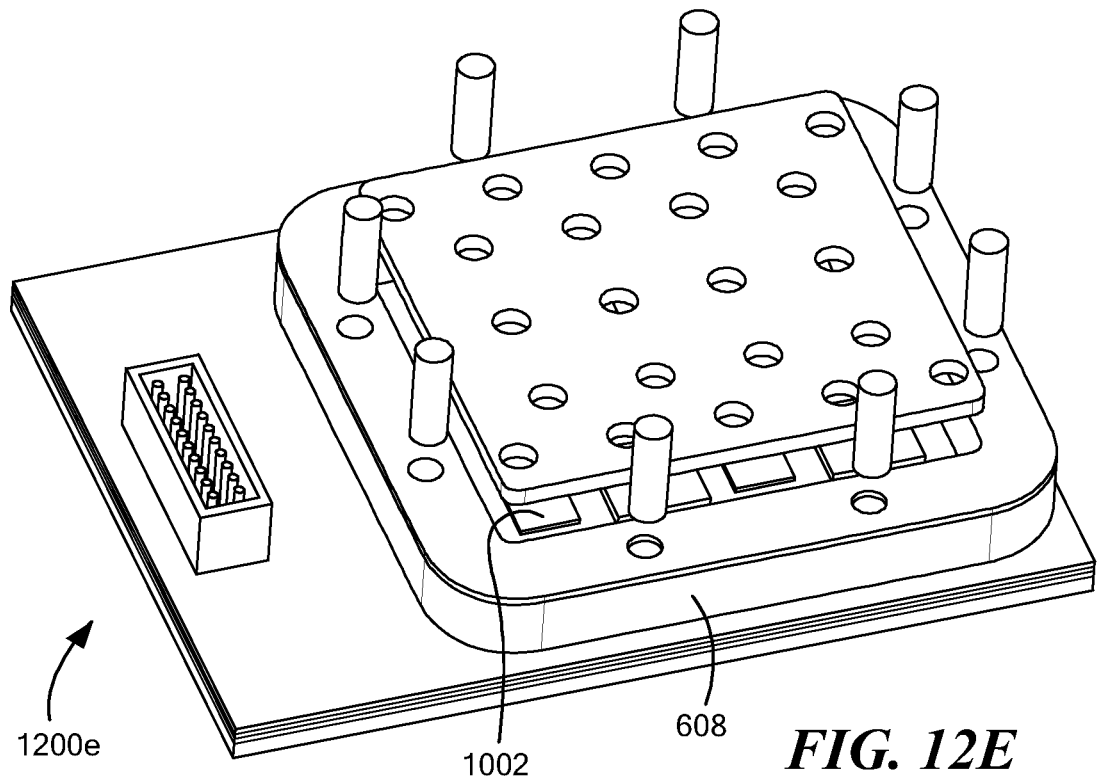
Figure 12F:
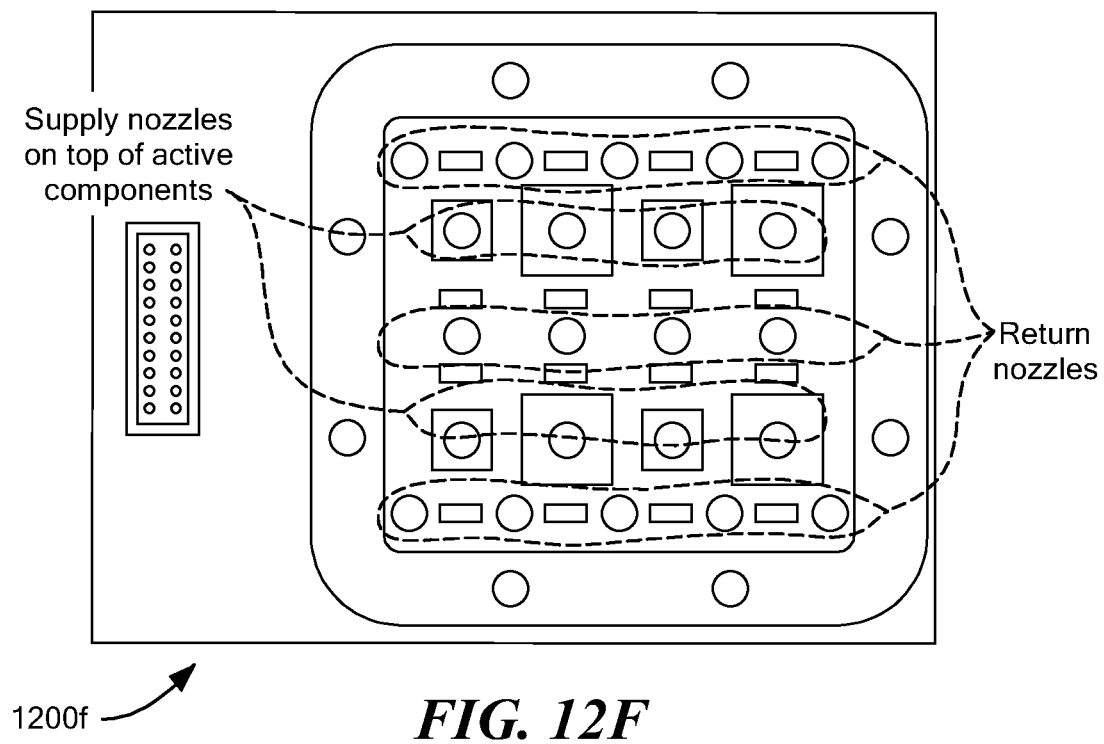

FIG. 12A shows the full stackup of the cooling manifold 1202, attached via fastening screws 1204, which hold together each layer in the stackup and couple them to the heat exchanger frame 608. The full stackup in FIG. 12A has 5 layers, with the top 4 overlaying the edge of the heat exchanger frame 608 and the bottom layer (shown in FIG. 12F) sized to fit within the heat exchanger frame 608 so as to make contact with the inner heat exchanger 1002 that was formed with the electroplating described above. FIG. 12A shows the stackup with all five layers—the four layers that overlay the heat exchanger frame 608 and the bottom layer (not visible in FIG. 12A) that lies within the frame, as noted above. FIG. 12B shows the stackup with three layers overlaying and the top layer removed. FIG. 12C shows the stackup with the top two overlaying layers removed, and two overlaying layers remaining. FIG. 12D shows the bottom layer that overlays the heat exchanger frame 608, and FIG. 12E, as noted above, shows the layer that falls within the heat exchanger frame. When all five layers of the manifold are mechanically coupled together (via screws 1204, e.g.,) and to the heat exchanger frame 608, they provide a path (e.g., via channels 1206a-1206f) for forced flow cooling. In addition, as will be understood by those of skill in the art, the full surface area of the manifold stack, which is in thermal contact with the heat exchanger frame 608 and the heat exchanger 1002, provides further heat dissipation.

Figure 13A:
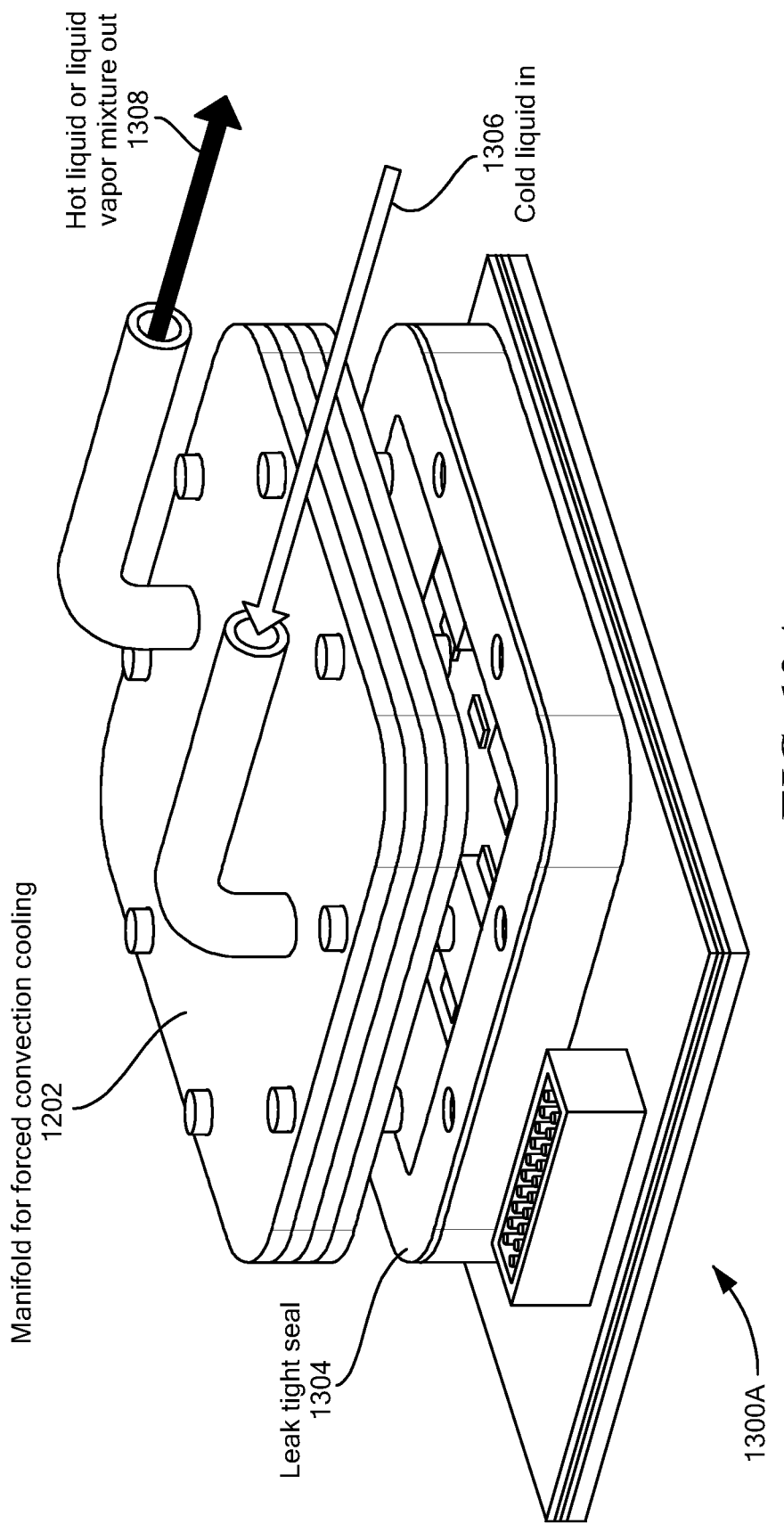
FIG. 13A is a first perspective view showing attachment of a manifold for forced flow liquid cooling to the heat exchanger frame, in accordance with one embodiment.
Figure 13B:
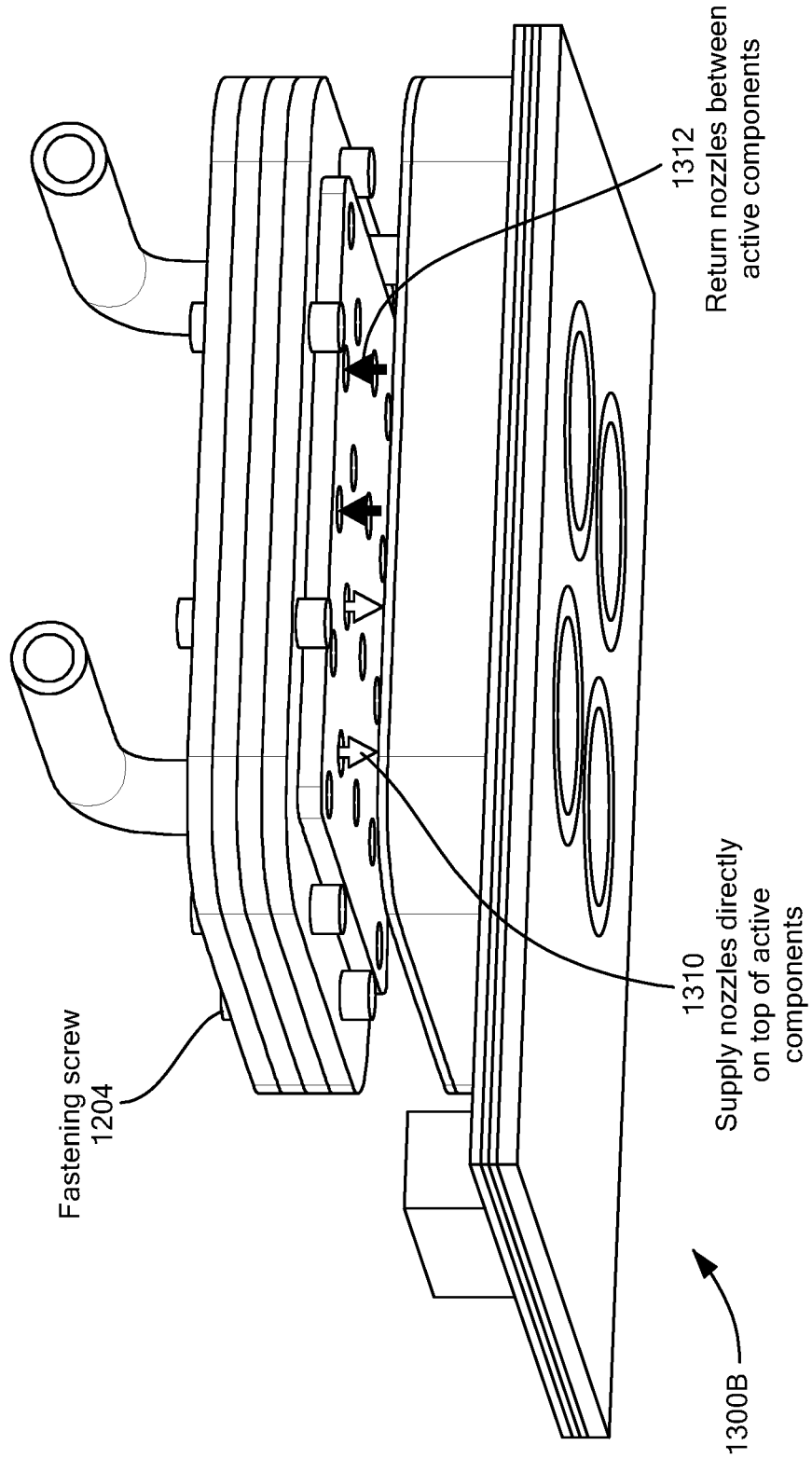
FIG. 13B is a second perspective view showing attachment of a manifold for forced flow liquid cooling to the heat exchanger frame, in accordance with one embodiment.

FIG. 13A is a first perspective view 1300A showing attachment of the manifold 1202 for forced flow liquid cooling to the heat exchanger frame, in accordance with one embodiment, and FIG. 13B is a second perspective view 1300b showing attachment of the manifold 1202 for forced flow liquid cooling to the heat exchanger frame, in accordance with one embodiment. FIG. 13A shows an exemplary implementations of a cooling manifold 1202 for forced convection cooling, which includes a leak tight seal 1304 and provides a path for cold liquid in 1306 and hot path 1308 for a hot liquid or liquid vapor mixture out. In the view of FIG. 13B, supply nozzles 1310 are placed directly over the center of active components (embedded in the heat exchanger 1002) to maximize liquid flow over the hottest areas of the chip. Return nozzles 1312 are located between active components. In the example embodiment of FIG. 13B, the manifold 1202 is attached via one or more fastening screws 1204, but this is not limiting; other means of fastening are, of course, usable.

Figure 14A:
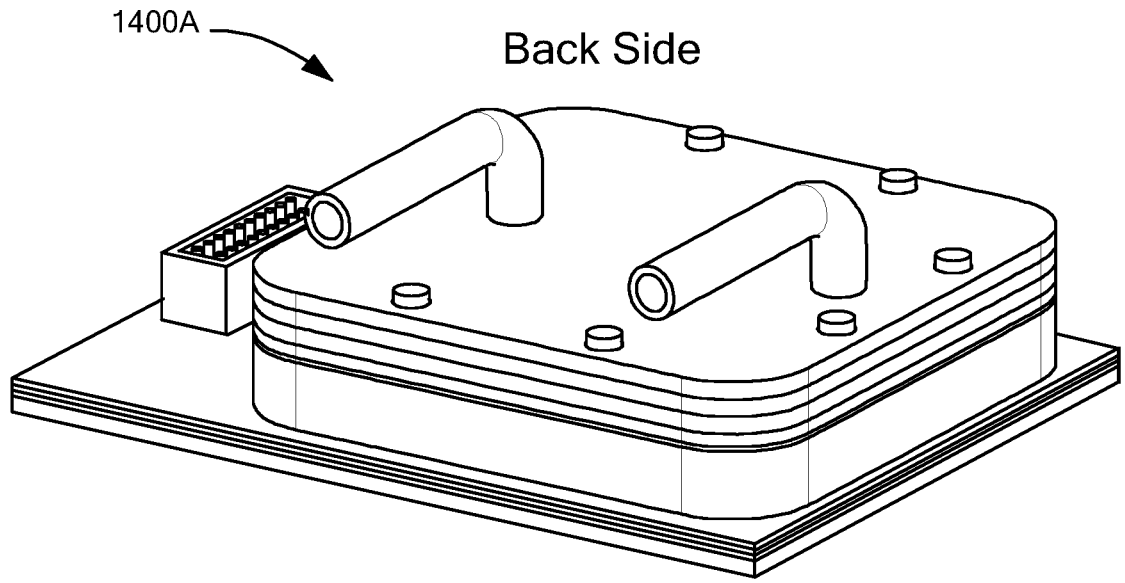
FIG. 14A is a perspective view of the back side of a fully assembled AESA panel having an integrated forced liquid flow heat exchanger, in accordance with one embodiment.
Figure 14B:
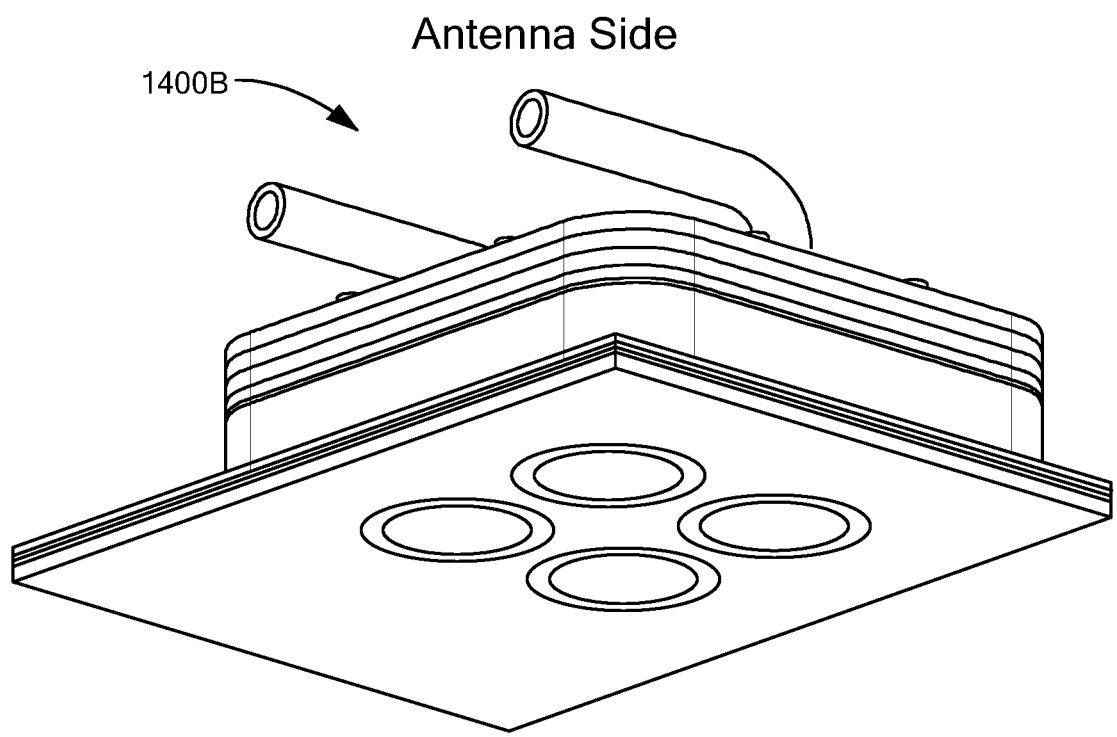
FIG. 14B is a perspective view of the antenna side of a fully assembled AESA panel having an integrated forced liquid flow heat exchanger, in accordance with one embodiment.

FIG. 14A is a perspective view 1400A of the back side of a fully assembled AESA panel having an integrated forced liquid flow heat exchanger, in accordance with one embodiment. FIG. 14B is a perspective view 1400B of the antenna side of a fully assembled AESA panel having an integrated forced liquid flow heat exchanger, in accordance with one embodiment.

In certain embodiments, optionally, fabricated liquid microchannels (block 380 of FIG. 3B) can be formed into the heat exchanger 1002 during the metal plating process, or may be added afterwards, to further enhance cooling near the heat generating components.

Referring again to FIG. 3B, the version 2 path provides cooling via fusible material attach (block 385), which can be useful for AESA systems that are operating intermittently for short period of time, because it eliminates need for a secondary heat exchanger that is needed to extract heat from a cooling liquid or liquid/vapor mixture. For example, FIG. 15A is perspective view 1500a of a first aspect of a fusible material attachment process, in accordance with one embodiment. Referring to FIGS. 3B and 15A, in block 387, a portion or block of low temperature fusible material 1502 is placed inside the heat exchanger cavity, where the heat exchanger cavity corresponds, in certain embodiments, to the area enclosed by the heat exchanger frame 608, which is located above the heat exchanger 1002 itself. In certain embodiments, the block of low temperature fusible material 1502 corresponds to a block of a fusible alloy material (also known in the art as Eutectic and Non-Eutectic alloys), such as alloys containing high percentages of Bismuth combined with Lead, Tin, Cadmium, Indium and other metals, but this is not limiting. By "low temperature" fusible or meltable material, it refers at least to alloys that melt below 360 Degrees. F. (160 Degrees. C). In certain embodiments, the heat exchanger frame 608 and the structure formed by the electroplating of the continuous sheet, form a cavity within the heat exchanger, and the low-temperature fusible material is melted and configured to substantially fill that cavity.

The block of low-temperature fusible material, in certain embodiments, is configured to form (when melted and then solidified) a leak proof seal between the power dissipating components that it covers and least a portion of the heat exchanger frame 608. In certain embodiments, the low-temperature fusible material is configured to have a quantity sufficient to fill the entire cavity, to form a leak proof seal that entirely fills the heat exchanger frame (e.g., as shown in FIG. 15A). Referring to FIG. 3B, the low-temperature fusible material, after being disposed inside the heat exchanger cavity (block 387) is subsequently melted (block 389) to ensure good thermal contact between the block of low-temperature fusible material 1502 and the active components that are embedded in the heat exchanger 1002.

After the fusible material 1502 solidifies (block 391), the heat exchanger cavity is covered by a lid 1506 (block 395) that is attached, e.g., via screws 1504, as shown in FIG. 15B, which is a perspective view 1500b, of a second aspect of a fusible material attachment process, in accordance with one embodiment. In certain embodiments, the lid 1506 is made from a thermally conductive material, to ensure thermal and electrical continuity between the heat exchanger structure 1002 (including the heat dissipating components), the fusible material 1502, and the heat exchanger frame 608. For example, the lid can be made of a metal (e.g., Cu, Al, etc.). In some embodiments, the lid 1506 is made from the same material as the heat exchanger frame 608. However, in certain embodiments, it is not required that the lid 1506 be made of thermally and electrically conductive material. FIG. 15C is a first perspective view of a fully assembled AESA panel after the fusible material attachment process, in accordance with one embodiment. FIG. 15D is a second perspective view of the fully assembled AESA panel of FIG. 13C, showing the antenna side, in accordance with one embodiment.

As the aforementioned description and figures show, the embodiments herein provide a way to implement effective thermal management of high power components on printed circuit board panels, using an arrangement that is simpler and more flexible than other techniques. The embodiments described in FIGS. 2-15D enable attaching integrated circuits (including those with solder balls and bumps) directly to a fabricated printed circuit board panel using a convention bump attach technique, with an underfill process, where interconnects between the chips are done through the printed circuit board panel. The process allows time for potentially testing and reworking the printed circuit board panel, which chips attached, before the metal heat spreader is deposited on the back side of the printed circuit board panel using electroplating.

This arrangement is simpler and quicker than other arrangements where a heat sink is formed on the back side of the printed circuit board before chip interconnections are made. For example, one alternate method of forming a heat sink or heat spreader is to electroplate a metal sheet directly over a bare chip die. This is done, for example by: (1) attaching one or more bare IC's to temporary carrier wafer with circuit side facing carrier wafer; (2) depositing a metal heat-sink on a back side of the bare IC using electroplating; (3) releasing the heat sink with embedded chips from the temporary carrier wafer; (4) forming electrical interconnects between chips by photolithography or wire bonds; and (5) forming additional chip interconnects by board mounting. This alternate method is less advantageous than the embodiments of FIGS. 2-15D because it requires provision and use of a temporary carrier wafer and also requires additional fabrication steps to interconnect chips. This alternate method also is challenging to extend to multilayer printed circuit board panels and panel AESAs.

In contrast, the techniques described herein result in fewer fabrication steps and a simpler fabrication process. Depositing and then later removing (after electroplating) the temporary protective resin layers and the exposed plating membranes, is a simpler and quicker process than the alternate method discussed above. Furthermore, the arrangement and embodiments of FIGS. 2-15D are compatible with conventional circuit card assembly (CCA) tools and CCA fabrication processes. No temporary carrier wafers are required. In addition, as noted above, by being able to form the heat spreader over chips already mounted to a circuit board panel, there is the ability and potential to test and re-work the circuit that is formed, before metal heat spreader deposition. This can save considerable money and time by enabling the test and re-work to happen before the heat spreader is attached, because once the heat spreader is electroplated onto anything, it is difficult to remove if re-work on the underlying circuit is needed.

Those of skill in the art will appreciate that the embodiments shown in FIGS. 2-15D are applicable to virtually any type of circuit where effective heat dissipation is needed. Although the above examples were described in the context of an AESA board panel, the embodiments are not limited to those types of circuits but have applicability to many different types of circuits.

The terms "comprises," "comprising", "includes", "including", "having" and their conjugates at least mean "including but not limited to". As used herein, the singular form "a," "an" and "the" includes plural references unless the context clearly dictates otherwise. Various elements, which are described in the context of a single embodiment, may also be provided separately or in any suitable subcombination. It will be further understood that various changes in the details, materials, and arrangements of the parts that have been described and illustrated herein may be made by those skilled in the art without departing from the scope of the following claims.

Throughout the present disclosure, absent a clear indication to the contrary from the context, it should be understood individual elements as described may be singular or plural in number. For example, the terms "circuit" and "circuitry" may include either a single component or a plurality of components, which are either active and/or passive and are connected or otherwise coupled together to provide the described function. Within the drawings, like or related elements have like or related alpha, numeric or alphanumeric designators. Further, while the disclosed embodiments have been discussed in the context of implementations using discrete components, including some components that include one or more integrated circuit chips), the functions of any component or circuit may alternatively be implemented using one or more appropriately programmed processors, depending upon the signal frequencies or data rates to be processed and/or the functions being accomplished.

Similarly, in addition, in the Figures of this application, the total number of elements or components shown is not intended to be limiting; those skilled in the art can recognize that the number of a particular component or type of element can, in some instances, be selected to accommodate the particular user needs.

In describing and illustrating the embodiments herein, in the text and in the figures, specific terminology (e.g., language, phrases, product brands names, etc.) may be used for the sake of clarity. These names are provided by way of example only and are not limiting. The embodiments described herein are not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, elements, circuits, modules, tables, software modules, systems, etc. Such terminology used herein, however, is for the purpose of description and not limitation.

Although the embodiments included herein have been described and pictured in an advantageous form with a certain degree of particularity, it is understood that the present disclosure has been made only by way of example, and that numerous changes in the details of construction and combination and arrangement of parts may be made without departing from the spirit and scope of the described embodiments. Having described and illustrated at least some the principles of the technology with reference to specific implementations, it will be recognized that the technology and embodiments described herein can be implemented in many other, different, forms, and in many different environments. The technology and embodiments disclosed herein can be used in combination with other technologies. In addition, all publications and references cited herein are expressly incorporated herein by reference in their entirety. Individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

What is claimed is:

1. A cooling apparatus, comprising:
a structure configured for coupling to a first side of a printed circuit board (PCB) having first and second sides and having at least a power dissipating component operably coupled to the first side, the power dissipating component having an underside comprising a plurality of solder contacts in operable communication with the PCB, wherein the structure comprises a thermally and electrically conductive material and is configured to define and separate first and second regions of the PCB when the structure is attached to the PCB, wherein the first region of the PCB is configured to surround the power dissipating component and the second region of the PCB lies outside of the structure and does not include the power dissipating component; and
an electrically and thermally conductive continuous sheet of material thermally and electrically coupled to the structure and configured to be in void-free thermal contact with the power dissipating component and in void-free thermal contact with all areas in the first region of the PCB that do not contain the power dissipating component, wherein the structure and the electrically and thermally conductive sheet of material, when thermally and electrically coupled together, form a heat exchanger.

2. The cooling apparatus of claim 1, further comprising a forced flow cooling manifold coupled to the structure.

3. The cooling apparatus of claim 1, wherein the structure and the electrically and thermally conductive continuous sheet of material together are configured to form a cavity within the heat exchanger and further comprising a portion of thermally conductive fusible material disposed within and configured to fill the cavity to form a leak-tight seal between the portion of thermally conductive fusible material and the structure.

4. The cooling apparatus of claim 1, wherein the structure comprises a heat exchanger frame configured to surround the power dissipating component.

5. A method of forming a heat spreader on a printed circuit board (PCB), the method comprising:
providing a PCB having first and second sides and having a power dissipating component operably coupled to a first side of the PCB, the power dissipating component having an underside disposed adjacent to the first side of the PCB and having a plurality of solder contacts disposed therein;
attaching a structure to the first side of the PCB, the structure comprising a thermally and electrically conductive material having a shape configured to define and separate first and second regions of the PCB, wherein the first region of the PCB includes the power dissipating component, and the second region of the PCB does not include the power dissipating component;
underfilling a space between the underside of the power dissipating component and the first side of the PCB with a first electrically insulating material configured to electrically insulate the solder contacts of the power dissipating component;
applying a layer of first temporary protective material to the second region of the PCB;
depositing a conductive plating membrane to the first region, the second region, and to the structure, wherein a first portion of the conductive plating membrane is configured to overlay the structure, the power dissipating component, and the first region, and wherein a second portion of the conductive plating membrane is configured to overlay the second region;
applying a layer of second temporary protective material over the second portion of the conductive plating membrane, wherein the layer of the second temporary protective material is configured to leave an exposed first portion of the conductive plating membrane; and
electroplating an electrically and thermally conductive continuous sheet of material over the exposed first portion of the conductive plating membrane, the electroplating configured to couple the electrically and thermally conductive continuous sheet of material to the structure, the power dissipating component, and to areas of the first side of the PCB that fall within the first region and which are not operably coupled to the power dissipating component, to form a heat exchanger.

6. The method of claim 5, further comprising performing a solder reflow after attaching the structure and before underfilling the space, wherein the solder reflow is configured to establish soldered bond contact between the power dissipating component, the structure, and the PCB.

7. The method of claim 5, wherein the PCB further comprises at least one passive component disposed in the first region of the PCB and further comprising, forming a protective structure around the passive component using a second electrically insulating material, prior to depositing the conductive plating membrane.

8. The method of claim 7, wherein the electroplating is configured to provide a void free interface between the heat exchanger and the heat dissipating component and between the heat exchanger and the protective structure.

9. The method of claim 5, wherein the electroplating is configured to provide a void-free interface between the heat exchanger and the power dissipating component.

10. The method of claim 5, wherein the structure comprises a heat exchanger frame configured to surround the power dissipating component.

11. The method of claim 5, further comprising coupling a forced flow cooling manifold to the structure after the electroplating.

12. The method of claim 5, wherein the structure and the electrically and thermally conductive continuous sheet of material, from the electroplating, together are configured to form a cavity within the heat exchanger and further comprising:
disposing a portion of fusible material within the cavity;
melting the fusible material to enable the fusible material to make thermal contact with a portion of the heat exchanger that is coupled to the power dissipating component; and
coupling a lid to the structure after the fusible material has solidified, the lid configured to make thermal contact with the fusible material.

13. The method of claim 12, wherein the portion of fusible material is a quantity that is sufficient, when melted to fill the cavity enough to form a leak-tight seal between the fusible material and the structure.

14. The method of claim 5, further comprising, after the electroplating:
removing the layer of second temporary protective material to expose the second portion of the conductive plating membrane;

removing the second portion of conductive plating membrane; and removing the layer of first temporary protective material.

15. The method of claim 14, further comprising coupling a forced flow cooling manifold to the structure after the layer of first temporary protective material is removed.

16. The method of claim 14, wherein the structure and the electrically and thermally conductive continuous sheet of material, from the electroplating, together are configured to form a cavity within the heat exchanger and further comprising, after the layer of first temporary protective material is removed:

disposing a portion of fusible material within the cavity;

melting the fusible material to enable the fusible material to make thermal contact with a portion of the heat exchanger that is coupled to the power dissipating component; and coupling a lid to the structure after the fusible material has solidified, the lid configured to make thermal contact with the fusible material.

17. A method of cooling a power dissipating component operably coupled to a first side of a printed circuit board (PCB), the power dissipating component having an underside disposed adjacent to the first side of the PCB and having a plurality of solder contacts disposed thereon, the method comprising:

attaching a structure to the first side of the PCB, the structure comprising a thermally and electrically conductive material having a shape configured to define and separate first and second regions of the PCB, wherein the first region of the PCB includes the power dissipating component, and the second region of the PCB does not include the power dissipating component;

underfilling a space between the underside of the power dissipating component and the first side of the PCB with a material configured to electrically insulate the solder contacts of the power dissipating component;

applying a layer of first temporary protective material to the second region of the PCB;

depositing a conductive plating membrane to the first region, the second region, and to the structure, wherein a first portion of the conductive plating membrane is configured to overlay the structure, the power dissipating component, and the first region, and wherein a second portion of the conductive plating membrane is configured to overlay the second region;

applying a layer of second temporary protective material over the second portion of the conductive plating membrane, wherein the layer of the second temporary protective material is configured to leave an exposed first portion of the conductive plating membrane; and electroplating an electrically and thermally conductive continuous sheet of material over the exposed first portion of the conductive plating membrane, the electroplating configured to couple the electrically and thermally conductive continuous sheet of material to the structure, the power dissipating component, and to areas of the first side of the PCB that fall within the first region and which are not operably coupled to the power dissipating component, to form a heat exchanger configured for cooling the power dissipating component, wherein the electroplating is configured to provide a void-free interface between the heat exchanger and the power dissipating component.

18. The method of claim 17, further comprising coupling a forced flow cooling manifold to the structure after the electroplating.

19. The method of claim 17, wherein the structure and the electrically and thermally conductive continuous sheet of material, from the electroplating, together are configured to form a cavity within the heat exchanger and further comprising:

disposing a portion of fusible material within the cavity;

melting the fusible material to enable the fusible material to make thermal contact with a portion of the heat exchanger that is coupled to the power dissipating component; and coupling a lid to the structure after the fusible material has solidified, the lid configured to make thermal contact with the fusible material.

20. The method of claim 17 further comprising, after the electroplating:

removing the layer of second temporary protective material to expose the second portion of the conductive plating membrane;

removing the second portion of conductive plating membrane; and removing the layer of first temporary protective material.

* * * * *